United States Patent
Tae et al.

(10) Patent No.: US 10,503,037 B2
(45) Date of Patent: Dec. 10, 2019

(54) DISPLAY DEVICE HAVING ROUNDED EDGES

(71) Applicant: Samsung Display Co., Ltd., Yongin-Si, Gyeonggi-Do (KR)

(72) Inventors: Chang Il Tae, Seoul (KR); Nam Seok Roh, Seongnam-si (KR); Joo Lark Son, Suwon-si (KR); Young Goo Song, Asan-si (KR); Seung Jun Yu, Cheonan-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 16/407,124

(22) Filed: May 8, 2019

(65) Prior Publication Data
US 2019/0265563 A1    Aug. 29, 2019

Related U.S. Application Data

(62) Division of application No. 15/692,807, filed on Aug. 31, 2017, now Pat. No. 10,303,025.

(30) Foreign Application Priority Data
Oct. 14, 2016   (KR) .................. 10-2016-0133561

(51) Int. Cl.
*H01L 27/12*     (2006.01)
*H01L 29/786*    (2006.01)
(Continued)

(52) U.S. Cl.
CPC .. *G02F 1/136277* (2013.01); *G02F 1/133512* (2013.01); *G02F 1/134309* (2013.01);
(Continued)

(58) Field of Classification Search
CPC ......... G02F 1/136277; G02F 1/134309; G02F 1/136209; G02F 1/133512;
(Continued)

(56) References Cited

U.S. PATENT DOCUMENTS 8,248,559 B2 ‡  8/2012  Morita ............. G02F 1/133512
                                                        349/11
8,318,270 B2 ‡  11/2012 Seong ................... C09K 19/12
                                                        252/29
(Continued)

FOREIGN PATENT DOCUMENTS

JP    2008-216357 A  ‡  9/2008
JP    2008-216357 A     9/2008
(Continued)

OTHER PUBLICATIONS

Extended European Search Report, Application No. 17195978.6, dated Feb. 15, 2018, pp. 1-7.‡

*Primary Examiner* — Tracie Y Green
(74) *Attorney, Agent, or Firm* — Innovation Counsel LLP

(57) ABSTRACT

The present disclosure relates to a display device, and the display device according to an exemplary embodiment includes: a substrate having a rounded edge; a light blocking member disposed around a display area of the substrate, wherein a corner of the light blocking member has a rounded edge; a plurality of pixels disposed on the substrate; and a pixel electrode disposed in each of the plurality of pixels, wherein the pixel electrode has a horizontal stem, a vertical stem, and a plurality of fine branches, wherein the plurality of pixels includes a first pixel at least partially overlapping the light blocking member and a second pixel adjacent to the first pixel and not overlapping the light blocking member, and wherein a shape of a fine branch disposed in the first pixel is different from a shape of a fine branch disposed in the second pixel.

11 Claims, 15 Drawing Sheets

(51) Int. Cl.
*G02F 1/1362* (2006.01)
*G02F 1/1343* (2006.01)
*H01L 23/538* (2006.01)
*H01L 27/32* (2006.01)
*H01L 51/52* (2006.01)
*G02F 1/1335* (2006.01)
*G09G 3/36* (2006.01)
*G02F 1/1337* (2006.01)
*G02F 1/1333* (2006.01)

(52) U.S. Cl.
CPC ..... *G02F 1/136209* (2013.01); *G09G 3/3659* (2013.01); *H01L 23/5385* (2013.01); *H01L 27/326* (2013.01); *H01L 51/5203* (2013.01); *G02F 1/133707* (2013.01); *G02F 2001/133388* (2013.01); *G02F 2001/134345* (2013.01); *G02F 2201/122* (2013.01); *G02F 2201/123* (2013.01); *G02F 2201/56* (2013.01); *G09G 2300/0426* (2013.01)

(58) Field of Classification Search
CPC .......... G02F 2201/123; G02F 2201/56; G02F 2001/133388; G02F 2001/01; G09G 3/3659; G09G 2300/0426; H01L 27/326; H01L 51/5203; H01L 23/5385
See application file for complete search history.

(56) References Cited

U.S. PATENT DOCUMENTS

| | | | | |
|---|---|---|---|---|
| 8,330,918 | B2 ‡ | 12/2012 | Han | G02F 1/134336 |
| | | | | 349/13 |
| 9,151,999 | B2 ‡ | 10/2015 | Nagami | G02F 1/136209 |
| 2009/0309813 | A1 ‡ | 12/2009 | Fujita | G02F 1/133512 |
| | | | | 345/55 |
| 2016/0120005 | A1 ‡ | 4/2016 | Wu | H05B 33/26 |
| | | | | 313/50 |
| 2016/0195780 | A1 ‡ | 7/2016 | Hong | G02F 1/133707 |
| | | | | 349/43 |
| 2017/0125448 | A1 ‡ | 5/2017 | Park | H01L 51/5284 |

FOREIGN PATENT DOCUMENTS

| | | | |
|---|---|---|---|
| JP | 2010-243 875 A | ‡ | 10/2010 |
| JP | 2010-243875 A | | 10/2010 |
| KR | 10-2011-0130177 A | ‡ | 12/2011 |
| KR | 10-2011-0130177 A | | 12/2011 |
| KR | 10-2012-0049816 A | ‡ | 5/2012 |
| KR | 10-2012-0049816 A | | 5/2012 |
| KR | 10-2016-0045185 A | ‡ | 4/2016 |
| KR | 10-2016-0045185 A | | 4/2016 |

‡ imported from a related application

DISPLAY DEVICE HAVING ROUNDED EDGES

RELATED APPLICATIONS

This application is a divisional application of U.S. patent application Ser. No. 15/692,807 filed Aug. 31, 2017, which claims priority to and the benefit of Korean Patent Application No. 10-2016-0133561, filed on Oct. 14, 2016, in the Korean Intellectual Property Office, the disclosure of which is incorporated herein in its entirety by reference.

BACKGROUND

1. Field

The present disclosure relates generally to display devices, and more specifically relates to display devices having rounded edges.

2. Description of the Related Art

A display device is a device displaying an image, and includes a liquid crystal display, an organic light emitting diode display, and the like. The display device is generally formed as an approximate quadrangle. Recently, display devices have been used in various applications, and a display device having a rounded edge has been developed.

The display device includes a plurality of pixels, which are disposed in a matrix shape. A light blocking member is disposed on an edge of the display device, and pixels disposed on a rounded edge may at least partially overlap the outside light blocking member. In this case, when turning off the pixel overlapping the outside light blocking member, there is a problem that an edge of a screen appears to have a stepped shape. And when turning on the pixel overlapping the outside light blocking member, some subpixels may be covered by the outside light blocking member so that luminance of some colors is reduced and a color shift is generated. For example, if only a red subpixel is covered by the outside light blocking member, a green band or a blue band may be recognized.

The above information disclosed in this Background section is only for enhancement of understanding of the background of the described technology and therefore it may contain information that does not form the prior art that is already known in this country to a person of ordinary skill in the art.

SUMMARY

Exemplary embodiments provide a display device in which color shift is not generated at a rounded edge, and a rounded edge does not appear as a step shape.

A display device according to an exemplary embodiment includes: a substrate having a rounded edge; a light blocking member disposed around a display area of the substrate, wherein a corner of the light blocking member has a rounded edge; a plurality of pixels disposed on the substrate; and a pixel electrode disposed in each of the plurality of pixels, wherein the pixel electrode has a horizontal stem, a vertical stem, and a plurality of fine branches, wherein the plurality of pixels includes a first pixel at least partially overlapping the light blocking member in plan view and a second pixel adjacent to the first pixel and not overlapping the light blocking member in plan view, and wherein a shape of a fine branch disposed in the first pixel is different from a shape of a fine branch disposed in the second pixel.

A width of the fine branch disposed in the first pixel may be different from a width of the fine branch disposed in the second pixel.

The plurality of pixels may respectively include a first subpixel representing a first color, a second subpixel representing a second color, and a third subpixel representing a third color, the first subpixel, the second subpixel, and the third subpixel may be arranged in successive manner along a first direction, the second pixel is adjacent to the first pixel in the first direction and is disposed farther from the edge of the substrate than the first pixel, and the pixel electrode may be disposed in the first subpixel, the second subpixel, and the third subpixel, respectively.

The first subpixel of the first pixel may overlap the light blocking member, and a width of the fine branches disposed in the second subpixel and the third subpixel of the first pixel may be narrower than a width of the fine branch disposed in the second pixel.

A space between the fine branches disposed in the second subpixel of the first pixel and between the fine branches disposed in the third subpixel of the first pixel may be wider than a space between the fine branches disposed in the second pixel.

A width of the fine branches disposed in the second subpixel and the third subpixel of the first pixel may be narrower than a width of the fine branch disposed in the first subpixel of the first pixel.

A space between the fine branches disposed in the second subpixel of the first pixel and between the fine branches disposed in the third subpixel of the first pixel may be wider than a space between the fine branches disposed in the first subpixel of the first pixel.

A width of the fine branch disposed in the first subpixel of the first pixel may be substantially the same as a width of the fine branch disposed in the second pixel.

The first subpixel of the first pixel may overlap the light blocking member, and a width of the fine branches disposed in the second subpixel and the third subpixel of the first pixel may be narrower than a width of the fine branch disposed in the first subpixel of the first pixel.

A space between the fine branches disposed in the second subpixel of the first pixel and between the fine branches disposed in the third subpixel of the first pixel may be wider than a space between the fine branches disposed in the first subpixel of the first pixel.

The first subpixel of the first pixel may overlap the light blocking member, and a width of the fine branch disposed in the first subpixel of the first pixel may be wider than a width of the fine branch disposed in the second pixel.

A space between the fine branches disposed in the first subpixel of the first pixel may be narrower than a space between the fine branches disposed in the second pixel.

A width of the fine branch disposed in the first subpixel of the first pixel may be wider than a width of the fine branches disposed in the second subpixel and the third subpixel of the first pixel.

A space between the fine branches disposed in the first subpixel of the first pixel may be narrower than a space between the fine branches disposed in the second subpixel and the third subpixel of the first pixel.

A width of the fine branches disposed in the second subpixel and the third subpixel of the first pixel may be substantially the same as a width of the fine branch disposed in the second pixel.

An angle between the horizontal stem and the fine branch disposed in the first pixel may be different from an angle between the horizontal stem and the fine branch disposed in the second pixel.

The plurality of pixels may respectively include a first subpixel representing a first color, a second subpixel representing a second color, and a third subpixel representing a third color, the first subpixel, the second subpixel, and the third subpixel may be arranged in successive manner along a first direction, the second pixel is adjacent to the first pixel in the first direction and disposed farther from the edge of the substrate than the first pixel, and the pixel electrode may be disposed in the first subpixel, the second subpixel, and the third subpixel, respectively.

The first subpixel of the first pixel may overlap the light blocking member, and an angle between the horizontal stems and the fine branches respectively disposed in the second subpixel and the third subpixel of the first pixel may be smaller than an angle between the horizontal stem and the fine branch disposed in the second pixel.

An angle between the horizontal stems and the fine branches respectively disposed in the second subpixel and the third subpixel of the first pixel may be smaller than an angle between the horizontal stem and the fine branch disposed in the first subpixel of the first pixel.

An angle between the horizontal stem and the fine branch disposed in the first subpixel of the first pixel may be smaller than an angle between the horizontal stem and the fine branch disposed in the second pixel.

The first subpixel of the first pixel may overlap the light blocking member, and an angle between the horizontal stems and the fine branches respectively disposed in the second subpixel and the third subpixel of the first pixel may be smaller than an angle between the horizontal stem and the fine branch disposed in the first subpixel of the first pixel.

The first subpixel of the first pixel may overlap the light blocking member, and an angle between the horizontal stem and the fine branch disposed in the first subpixel of the first pixel may be larger than an angle between the horizontal stem and the fine branch disposed in the second pixel.

The angle between the horizontal stem and the fine branch disposed in the first subpixel of the first pixel may be larger than an angle between the horizontal stem and the fine branches respectively disposed in the second subpixel and the third subpixel of the first pixel.

An angle between the horizontal stems and the fine branches respectively disposed in the second subpixel and the third subpixel of the first pixel may be substantially the same as the angle between the horizontal stem and the fine branch disposed in the second pixel.

A display device according to an exemplary embodiment includes: a substrate having a rounded edge; a light blocking member disposed around a display area of the substrate, wherein a corner of the light blocking member has a rounded edge; a plurality of pixels disposed on the substrate; and a pixel electrode disposed in each of the plurality of pixels, wherein the pixel electrode has a horizontal stem, a vertical stem, and a plurality of fine branches, wherein the plurality of pixels includes a first pixel adjacent to the light blocking member and a second pixel adjacent to the first pixel, and wherein a size of the first pixel is smaller than a size of the second pixel.

A shape of the fine branch disposed in the first pixel may be different from a shape of the fine branch disposed in the second pixel.

The second pixel may be disposed farther from the edge of the substrate than the first pixel.

A width of the fine branch disposed in the first pixel may be wider than a width of the fine branch disposed in the second pixel.

A space between the fine branches disposed in the first pixel may be narrower than a space between the fine branches disposed in the second pixel.

An angle between the horizontal stem and the fine branch disposed in the first pixel may be larger than an angle between the horizontal stem and the fine branch disposed in the second pixel.

The plurality of pixels may respectively include a first subpixel representing a first color, a second subpixel representing a second color, and a third subpixel representing a third color, a size of the first subpixel, a size of the second subpixel, and a size of the third subpixel may be substantially the same, and a shape of the first subpixel, a shape of the second pixel, and a shape of the third subpixel may be different from each other.

A display device according to an exemplary embodiment includes: a substrate having a rounded edge; a light blocking member disposed around a display area of the substrate, wherein a corner of the light blocking member has a rounded edge; and a plurality of pixels disposed on the substrate, wherein the plurality of pixels include: a first subpixel directly adjacent to the light blocking member; and a second subpixel directly adjacent to the first subpixel, and wherein a length of an upper edge of the first subpixel is longer than a length of an upper edge of the second subpixel, or a length of a lower edge of the first subpixel is longer than a length of a lower edge of the second subpixel.

The second subpixel may be disposed farther from the edge of the substrate than the first subpixel.

An area of the second subpixel may be substantially the same as an area of the first subpixel.

When the length of the upper edge of the first subpixel is longer than the length of the upper edge of the second subpixel, the length of the lower edge of the first subpixel may be shorter than the length of the lower edge of the second subpixel, and when the length of the lower edge of the first subpixel is longer than the length of the lower edge of the second subpixel, the length of the upper edge of the first subpixel may be shorter than the length of the upper edge of the second subpixel.

According to exemplary embodiments, it is possible to prevent the color shift from being generated and the rounded edge of the display device may be prevented from being represented as a step shape.

DETAILED DESCRIPTION

Figure 1:
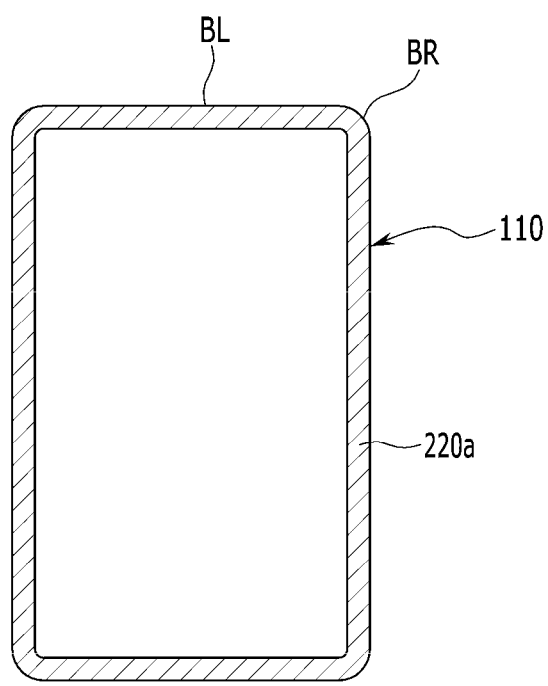
FIG. 1 is a top plan view showing a display device according to an exemplary embodiment.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In order to clearly explain the present invention, portions that are not directly related to the present invention are omitted, and the same reference numerals are attached to the same or similar constituent elements through the entire specification.

In addition, the size and thickness of each configuration shown in the drawings are arbitrarily shown for better understanding and ease of description, but the present invention is not limited thereto. In the drawings, the thickness of layers, films, panels, regions, etc., are exaggerated for clarity. In the drawings, for better understanding and ease of description, the thicknesses of some layers and areas are exaggerated. The drawings are thus not necessarily to scale.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, in the specification, the phrase "on a plane" means viewing the object portion from the top, and the phrase "on a cross-section" means viewing a cross-section of which the object portion is vertically cut from the side.

All numerical values are approximate, and may vary. All examples of specific materials and compositions are to be taken as nonlimiting and exemplary only. Other suitable materials and compositions may be used instead.

First, a display device according to an exemplary embodiment will be described with reference to FIG. 1.

FIG. 1 is a top plan view showing a display device according to an exemplary embodiment.

A display device according to an exemplary embodiment includes a first substrate 110, and a plurality of pixels are positioned on the first substrate 110. Although not shown, each pixel includes a thin film transistor and a pixel electrode connected to the thin film transistor. By controlling a data voltage applied to the pixel electrode of each pixel, luminance of each pixel may be controlled, thereby displaying an image on the screen. The display device according to the present exemplary embodiment may be a liquid crystal display, an organic light emitting diode display, etc.

The first substrate 110 is entirely formed as a quadrangle, and each corner has a rounded shape. That is, the first substrate 110 includes a straight edge (BL) and a rounded edge (BR). The first substrate 110 includes four straight edges BL, and a rounded edge BR is positioned between adjacent pairs of the straight edges BL. The shape of the display device is determined depending on the shape of the first substrate 110. That is, the display device according to the present exemplary embodiment is entirely formed as the quadrangle like the shape of the first substrate 110, and each corner has the rounded shape.

However, the exemplary embodiment is not limited thereto, and the first substrate 110 may be formed of various shapes with rounded edges. Also, the first substrate 110 may be made to be circular or oval.

The display device according to the present exemplary embodiment includes an outside light blocking member 220a formed according to an edge of the first substrate 110. The outside light blocking member 220a may overlap the rounded edge BR and may also overlap the straight edge BL. The outside light blocking member 220a is made of a light blocking material, thereby preventing light leakage.

Next, the pixels positioned at the rounded edge of the display device according to an exemplary embodiment and the pixels adjacent thereto will be described with reference to FIG. 2.

Figure 2:
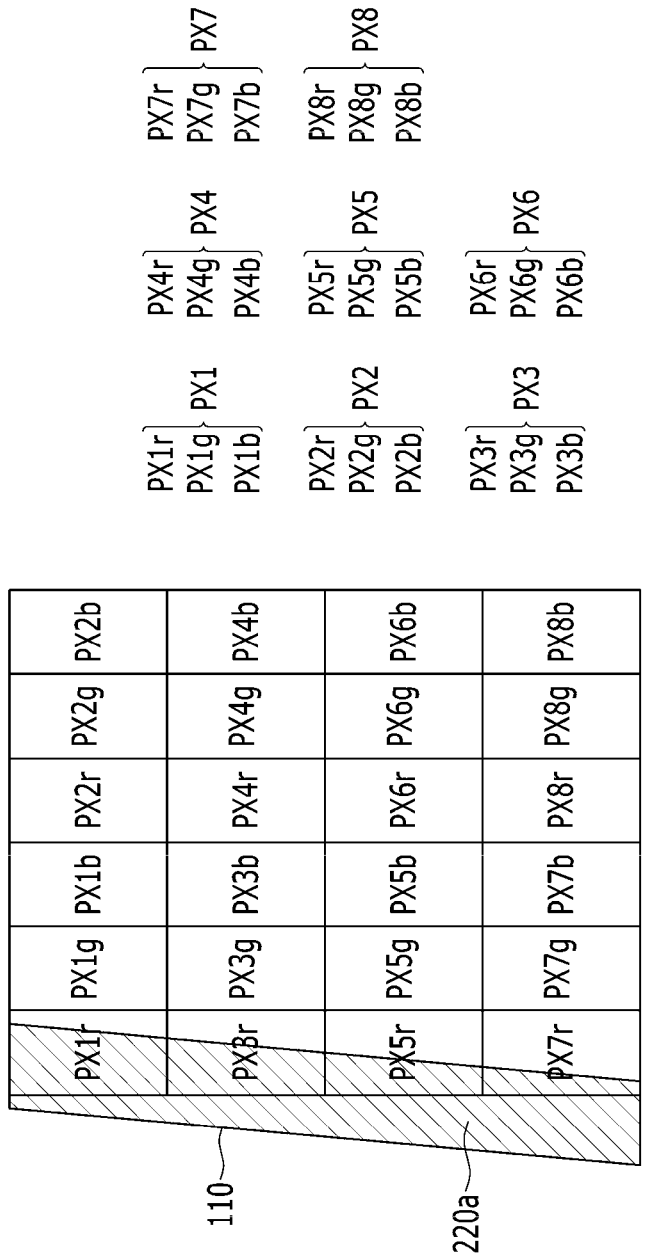
FIG. 2 is a top plan view showing a portion of pixels of a display device according to an exemplary embodiment.

FIG. 2 is a top plan view showing a portion of pixels of a display device according to an exemplary embodiment. FIG. 2 shows the pixels positioned at the rounded edge and the pixels adjacent thereto.

A first pixel PX1, a second pixel PX2, a third pixel PX3, a fourth pixel PX4, a fifth pixel PX5, a sixth pixel PX6, a seventh pixel PX7, and an eighth pixel PX8 are positioned on the first substrate 110 of the display device according to an exemplary embodiment.

The pixels PX1, PX2, PX3, PX4, PX5, PX6, PX7, and PX8 respectively include a first subpixel PX1r, PX2r, PX3r, PX4r, PX5r, PX6r, PX7r, and PX8r, a second subpixel PX1g, PX2g, PX3g, PX4g, PX5g, PX6g, PX7g, and PX8g, and a third subpixel PX1b, PX2b, PX3b, PX4b, PX5b, PX6b, PX7b, and PX8b. That is, the first pixel PX1 includes the first subpixel PX1r, the second subpixel PX1g, and the third subpixel PX1b; the second pixel PX2 includes the first subpixel PX2r, the second subpixel PX2g, and the third subpixel PX2b; the third pixel PX3 includes the first subpixel PX3r, the second subpixel PX3g, and the third subpixel PX3b; and the fourth pixel PX4 includes the first subpixel PX4r, the second subpixel PX4g, and the third subpixel PX4b. The fifth pixel PX5 includes the first subpixel PX5r, the second subpixel PX5g, and the third subpixel PX5b; the sixth pixel PX6 includes the first subpixel PX6r, the second subpixel PX6g, and the third subpixel PX6b; the seventh pixel PX7 includes the first subpixel PX7r, the second subpixel PX7g, and the third subpixel PX7*b*; and the eighth pixel PX8 includes the first subpixel PX8*r*, the second subpixel PX8*g*, and the third subpixel PX8*b*.

Each of the first subpixels PX1*r*, PX2*r*, PX3*r*, PX4*r*, PX5*r*, PX6*r*, PX7*r*, and PX8*r* may be subpixels displaying a red color; each of the second subpixels PX1*g*, PX2*g*, PX3*g*, PX4*g*, PX5*g*, PX6*g*, PX7*g*, and PX8*g* may be subpixels displaying a green color; and each of the third subpixels PX1*b*, PX2*b*, PX3*b*, PX4*b*, PX5*b*, PX6*b*, PX7*b*, and PX8*b* may be subpixels displaying a blue color. The subpixels displaying the same color may be disposed in the same column. However, the arrangement shape of the subpixels is not limited thereto and may be variously changed. Also, while each pixel includes the red subpixel, the green subpixel, and the blue subpixel, the present invention is not limited thereto. A first color displayed by the first subpixels PX1*r*, PX2*r*, PX3*r*, PX4*r*, PX5*r*, PX6*r*, PX7*r*, and PX8*r*; a second color displayed by the second subpixels PX1*g*, PX2*g*, PX3*g*, PX4*g*, PX5*g*, PX6*g*, PX7*g*, and PX8*g*; and a third color displayed by the third subpixels PX1*b*, PX2*b*, PX3*b*, PX4*b*, PX5*b*, PX6*b*, PX7*b*, and PX8*b* are mixed to make white. Accordingly, the first color, the second color, and the third color may be any other colors such as primary colors like cyan, magenta, and yellow, instead of red, green, and blue. The pixel may further include a while subpixel.

In each of the pixels PX1, PX2, PX3, PX4, PX5, PX6, PX7, and PX8, the first subpixel PX1*r*, PX2*r*, PX3*r*, PX4*r*, PX5*r*, PX6*r*, PX7*r*, and PX8*r*; the second subpixel PX1*g*, PX2*g*, PX3*g*, PX4*g*, PX5*g*, PX6*g*, PX7*g*, and PX8*g*; and the third subpixel PX1*b*, PX2*b*, PX3*b*, PX4*b*, PX5*b*, PX6*b*, PX7*b*, and PX8*b* are disposed in a first direction. For example, the first direction may be a row direction.

The outside light blocking member 220*a* overlaps the edge of the first substrate 110, and some pixels of the plurality of pixels (PX1, PX2, PX3, PX4, PX5, PX6, PX7, and PX8) overlap the outside light blocking member 220*a*. For example, the first pixel PX1, the third pixel PX3, the fifth pixel PX5 and the seventh pixel PX7 may overlap the outside light blocking member 220*a*.

The first subpixel PX1*r* of the first pixel PX1 may overlap the outside light blocking member 220*a*. The second subpixel PX1*g* and the third subpixel PX1*b* of the first pixel do not overlap the outside light blocking member 220*a*, and the second pixel PX2 adjacent to the first pixel PX1 in the row direction does not overlap the outside light blocking member 220*a*. The second pixel PX2 is disposed farther from the edge of the first substrate 110 than the first pixel PX1.

The first subpixel PX3*r* of the third pixel PX3 may overlap the outside light blocking member 220*a*. The second subpixel PX3*g* and the third subpixel PX3*b* of the third pixel PX3 do not overlap the outside light blocking member 220*a*, and the fourth pixel PX4 adjacent to the third pixel PX3 in the row direction does not overlap the outside light blocking member 220*a*. The fourth pixel PX4 is disposed farther from the edge of the first substrate 110 than the third pixel PX3.

The first subpixel PX5*r* of the fifth pixel PX5 may overlap the outside light blocking member 220*a*. The second subpixel PX5*g* and the third subpixel PX5*b* of the fifth pixel PX5 do not overlap the outside light blocking member 220*a*, and the sixth pixel PX6 adjacent to the fifth pixel PX5 in the row direction does not overlap the outside light blocking member 220*a*. The sixth pixel PX6 is disposed farther from the edge of the first substrate 110 than the fifth pixel PX5.

The first subpixel PX7*r* of the seventh pixel PX7 may overlap the outside light blocking member 220*a*. The second subpixel PX7*g* and the third subpixel PX7*b* of the seventh pixel PX7 do not overlap the outside light blocking member 220*a*, and the eighth pixel PX8 adjacent to the seventh pixel PX7 in the row direction does not overlap the outside light blocking member 220*a*. The eighth pixel PX8 is disposed farther from the edge of the first substrate 110 than the seventh pixel PX7.

Next, a subpixel of a display device according to an exemplary embodiment will be described with reference to FIG. 3 and FIG. 4.

Figure 3:
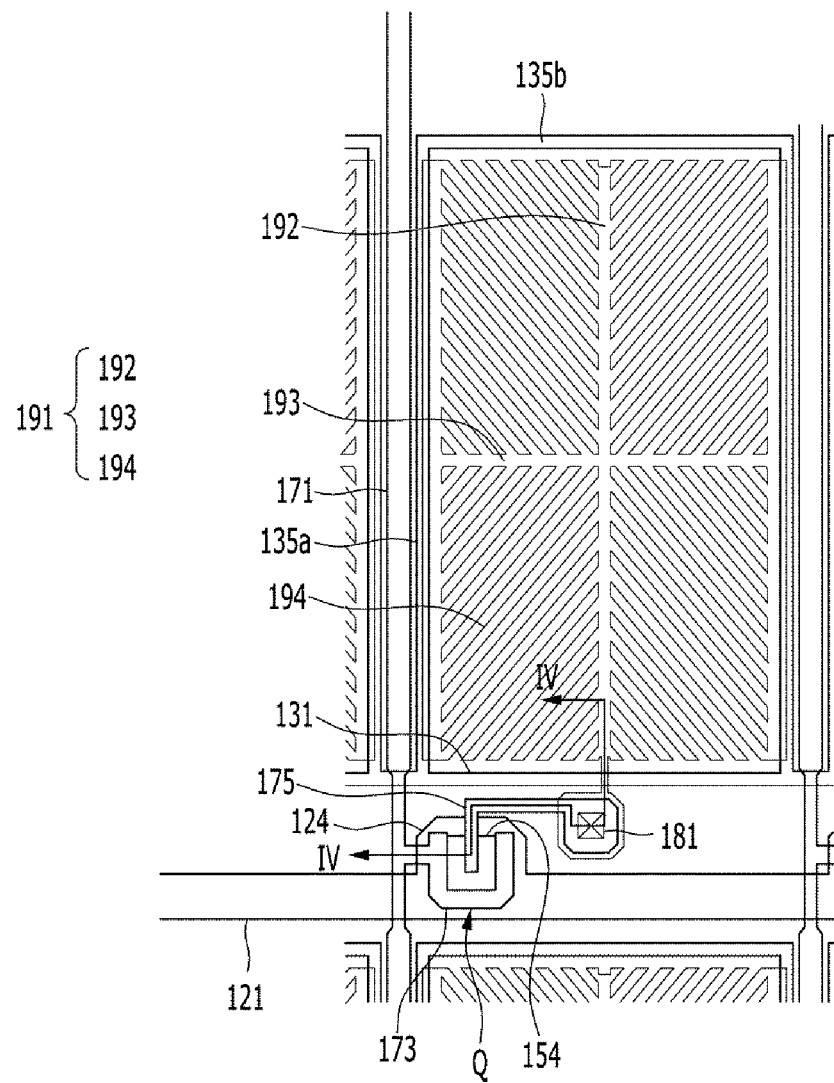
FIG. 3 is a top plan view showing a subpixel of a display device according to an exemplary embodiment.
Figure 4:
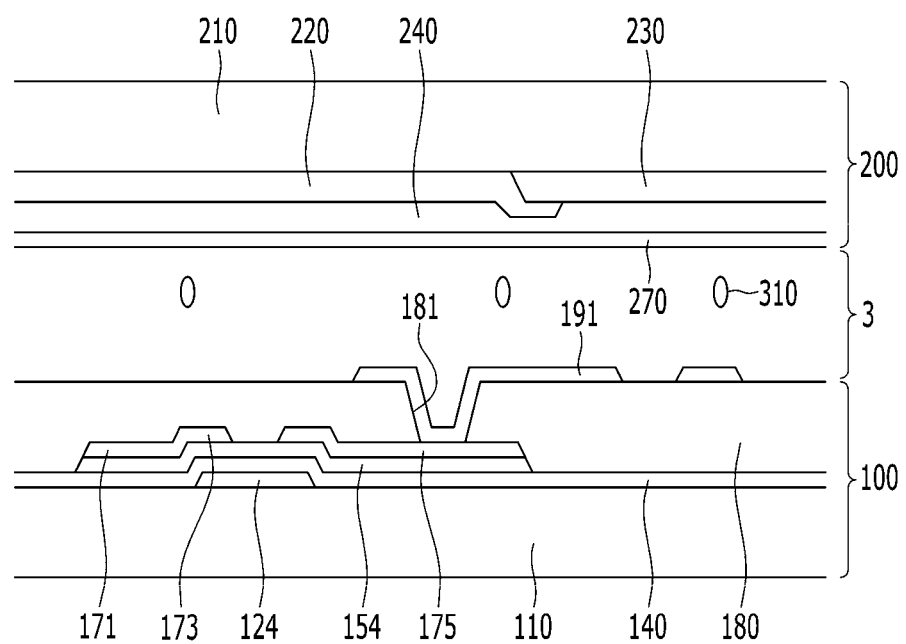
FIG. 4 is a cross-sectional view taken along the line IV-IV of FIG. 3.

FIG. 3 is a top plan view showing a subpixel of a display device according to an exemplary embodiment, and FIG. 4 is a cross-sectional view taken along the line IV-IV of FIG. 3.

As shown in FIG. 3 and FIG. 4, a display device according to an exemplary embodiment includes a lower display panel 100 and an upper display panel 200 facing each other, with a liquid crystal layer 3 interposed between the lower display panel 100 and the upper display panel 200.

First, the lower display panel 100 will be described.

A gate line 121 and a gate electrode 124 protruding from the gate line 121 are disposed on the first substrate 110.

The gate line 121 substantially extends in a horizontal direction and transmits the gate signal. The gate electrode 124 protrudes upward from the gate line 121 in plan view. The present invention is not limited thereto, and a protruding shape of the gate electrode 124 is modifiable in various ways. The gate electrode 124 may not protrude from the gate line 121, but may instead be disposed on the gate line 121. A reference voltage line 131 and storage electrodes 135*a* and 135*b* protruding from the reference voltage line 131 may be further disposed on the first substrate 110.

The reference voltage line 131 substantially extends in parallel to the gate line 121, and is separated from the gate line 121. A constant voltage may be applied to the reference voltage line 131. The storage electrodes 135*a* and 135*b* include a pair of first storage electrodes 135*a* substantially extending perpendicular to the reference voltage line 131, and a second storage electrode 135*b* for connecting the pair of first storage electrodes 135*a*. The reference voltage line 131 and the storage electrodes 135*a* and 135*b* may surround a pixel electrode 191 that is further described below.

A gate insulating layer 140 is disposed on the gate line 121, the gate electrode 124, the reference voltage line 131, and the storage electrodes 135*a* and 135*b*. The gate insulating layer 140 may be made of an inorganic insulating material such as a silicon nitride (SiNx) or a silicon oxide (SiOx). The gate insulating layer 140 may also be made of a single layer or multiple layers.

A semiconductor 154 is disposed on the gate insulating layer 140. The semiconductor 154 may be disposed on the gate electrode 124. The semiconductor 154 may be made of amorphous silicon, polycrystalline silicon, or a metal oxide.

An ohmic contact (not shown) may be further disposed on the semiconductor 154. The ohmic contact may be made of a material such as a silicide or n+ hydrogenated amorphous silicon doped with an n-type impurity at a high concentration.

A data line 171, a source electrode 173, and a drain electrode 175 are disposed on the semiconductor 154 and the gate insulating layer 140.

The data line 171 transmits a data signal and substantially extends in the vertical direction to cross the gate line 121 and the reference voltage line 131. The source electrode 173 protrudes over the gate electrode 124 from the data line 171, and it may be bent in a U shape. The drain electrode 175 includes a wide end portion and a bar-type end portion. The wide end portion of the drain electrode 175 overlaps the pixel electrode 191. The bar-type end portion of the drain electrode 175 is partially surrounded by the source electrode 173. The present invention is not limited thereto, and the source electrode 173 and the drain electrode 175 may have various different shapes.

The gate electrode 124, the source electrode 173, and the drain electrode 175 collectively form a thin film transistor (TFT) Q along with the semiconductor 154. In this instance, a channel of the thin film transistor Q is formed in the semiconductor 154 between the source electrode 173 and the drain electrode 175.

A passivation layer 180 is disposed on the data line 171, the source electrode 173, and the drain electrode 175. The passivation layer 180 is further disposed on a portion of the semiconductor 154 between the source electrode 173 and the drain electrode 175. The passivation layer 180 may be made of an organic insulating material or an inorganic insulating material, and it may be made of a single layer or multiple layers.

A contact hole 181 overlapping at least a portion of the drain electrode 175 is formed in the passivation layer 180. The contact hole 181 may expose the wide end portion of the drain electrode 175.

A pixel electrode 191 is formed on the passivation layer 180. The pixel electrode 191 may be made of a transparent conductive material such as an indium-tin oxide (ITO) or an indium-zinc oxide (IZO). The pixel electrode 191 is connected to the drain electrode 175 through the contact hole 181. Therefore, when the thin film transistor Q is turned on, the pixel electrode 191 receives a data voltage through the drain electrode 175.

The pixel electrode 191 has a generally quadrangular shape, and the pixel electrode 191 includes a horizontal stem 193 and a vertical stem 192 crossing each other, with fine branches 194 extending therefrom. The pixel electrode 191 is divided into four sub-regions by the horizontal stem 193 and the vertical stem 192. The fine branches 194 extend from the horizontal stem 193 and the vertical stem 192 in an oblique manner, and the extending direction may form an angle of about 45 degrees or 135 degrees with respect to the gate line 121 or the horizontal stem 193.

In the present exemplary embodiment, the pixel electrode 191 may further include an external stem surrounding the subpixel.

The above-described form of the subpixel, the structure of the thin film transistor, and the shape of the pixel electrode are one example, and the present invention is not limited thereto. Numerous variations are possible. For example, one subpixel may include a plurality of regions, and a different voltage may be applied to each region. For this purpose, a plurality of thin film transistors may be formed in one subpixel.

Although not shown, a first alignment layer may be formed on an inner surface of the lower display panel 100. The first alignment layer may be disposed on the pixel electrode 191.

Next, the upper display panel 200 will be described.

A light blocking member 220 is formed on a second substrate 210 made of transparent glass, plastic, or the like. The light blocking member 220 is also called a black matrix and prevents light leakage. The light blocking member 220 may be formed at a boundary part of each subpixel, such as over the gate line 121, the data line 171, the thin film transistor Q, and the like. In the present exemplary embodiment, the light blocking member 220 is formed on the upper panel 200, but the present invention is not limited thereto. The light blocking member 220 may be formed in the lower panel 100.

The outside light blocking member 220a described above may be disposed in the same layer as the light blocking member 220 or may be disposed in another layer. That is, the outside light blocking member 220a may be disposed in the upper panel 200 or may be disposed in the lower panel 100.

A plurality of color filters 230 is also formed on the second substrate 210. The color filters 230 may be mainly present in regions enclosed by the light blocking member 220, and may be extended in the vertical direction along a column of the pixel electrodes 191. Each of the color filters 230 may display one of primary colors such as red, green, and blue. Examples of the primary colors may include the three primary colors of red, green, and blue, or yellow, cyan, magenta, and the like. For example, a red color filter may be disposed on the first subpixels PX1r, PX2r, PX3r, PX4r, PX5r, PX6r, PX7r, and PX8r, a green color filter may be disposed on the second subpixels PX1g, PX2g, PX3g, PX4g, PX5g, PX6g, PX7g, and PX8g, and a blue color filter may be disposed on the third subpixels PX1b, PX2b, PX3b, PX4b, PX5b, PX6b, PX7b, and PX8b. Although not shown, the color filters may further include a color filter displaying a mixed color of the primary colors or white in addition to the primary colors.

In the present exemplary embodiment, the color filter 230 is formed on the upper panel 200, but the present invention is not limited thereto. The color filter 230 may be formed in the lower panel 100.

An overcoat 240 may be formed on the color filters 230 and the light blocking member 220. The overcoat 240 may be made of an organic insulating material, prevents the color filters 230 from being exposed, and provides a flat surface. The overcoat 240 may also be omitted.

A common electrode 270 is formed on the overcoat 240. The common electrode 270 may be made of a transparent conductive material such as an indium-tin oxide (ITO) or an indium-zinc oxide (IZO). A common voltage may be applied to the common electrode 270, and the common voltage may be a predetermined voltage.

Although not shown, a second alignment layer may be formed on an inner surface of the upper display panel 200. The second alignment layer may be disposed on the common electrode 270.

The liquid crystal layer 3 may include liquid crystal molecules 310 having negative dielectric anisotropy, and the liquid crystal molecules 310 of the liquid crystal layer 3 may be arranged so that long sides thereof are perpendicular to surfaces of the lower display panel 100 and the upper display panel 200 while no electric field is applied.

The pixel electrode 191 to which a data voltage is applied generates the electric field together with the common electrode 270, to determine the direction of the liquid crystal molecules 310 of the liquid crystal layer 3 disposed between the pixel electrodes 191 and the common electrode 270. Luminance of light passing through the liquid crystal layer 3 becomes different according to the determined direction of the liquid crystal molecules 310.

Next, a difference between shapes of two subpixels adjacent to each other according to an exemplary embodiment will be described with reference to FIG. 5 to FIG. 8.

Figure 5:
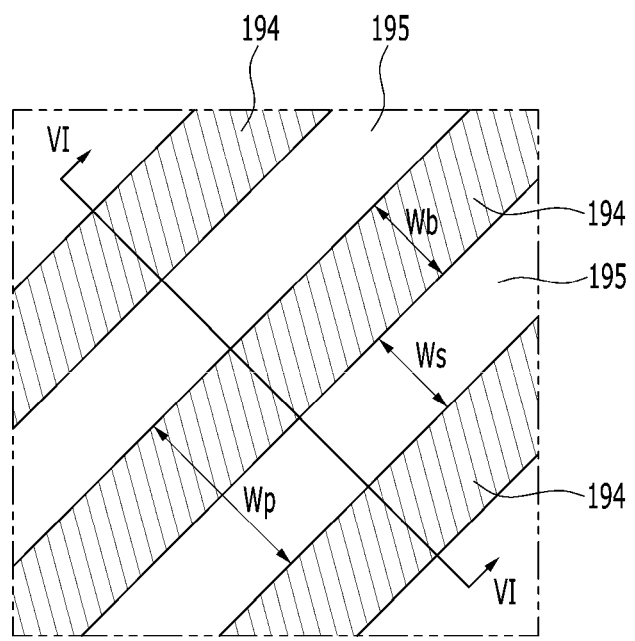
FIG. 5 is a top plan view showing a portion of a pixel electrode of one subpixel of a display device according to an exemplary embodiment.
Figure 6:
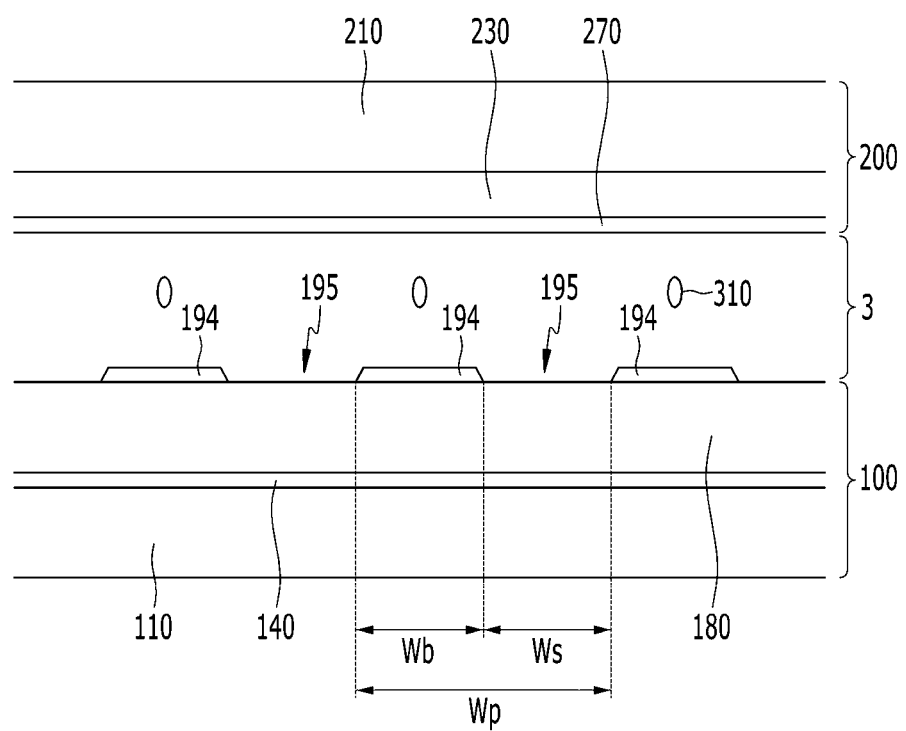
FIG. 6 is a cross-sectional view taken along the line VI-VI of FIG. 5.
Figure 7:
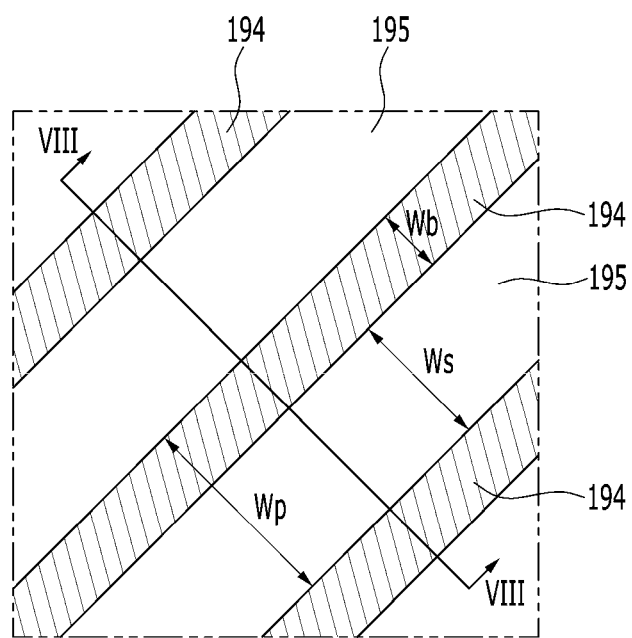
FIG. 7 is a top plan view showing a portion of a pixel electrode of another subpixel of a display device according to an exemplary embodiment.

FIG. 5 is a top plan view showing a portion of a pixel electrode of one subpixel of a display device according to an exemplary embodiment, and FIG. 6 is a cross-sectional view taken along the line VI-VI of FIG. 5. FIG. 7 is a top plan view showing a portion of a pixel electrode of another subpixel of a display device according to an exemplary embodiment, and FIG. 8 is a cross-sectional view taken along the line VIII-VIII of FIG. 7.

As shown FIG. 5 and FIG. 6, the pixel electrode 191 includes a plurality of fine branches 194 and fine slits 195 formed between adjacent fine branches 194. The plurality of fine branches 194 is connected to the horizontal stem 193 and the vertical stem 192 so that a data voltage is applied to the plurality of fine branches 194 when the thin film transistor Q is turned on. The plurality of fine branches 194 is separated from each other to have a predetermined space. Each fine slit 195 is a space between two fine branches 194.

The width Wb of the fine branch 194 and a space Ws between the fine branches 194 may be constant in one subpixel. A pitch Wp of the pixel electrode 191 is defined as a sum of the width Wb of the fine branch 194 and the space Ws between the fine branches 194, and the pitch Wp may also be constant.

Figure 8:
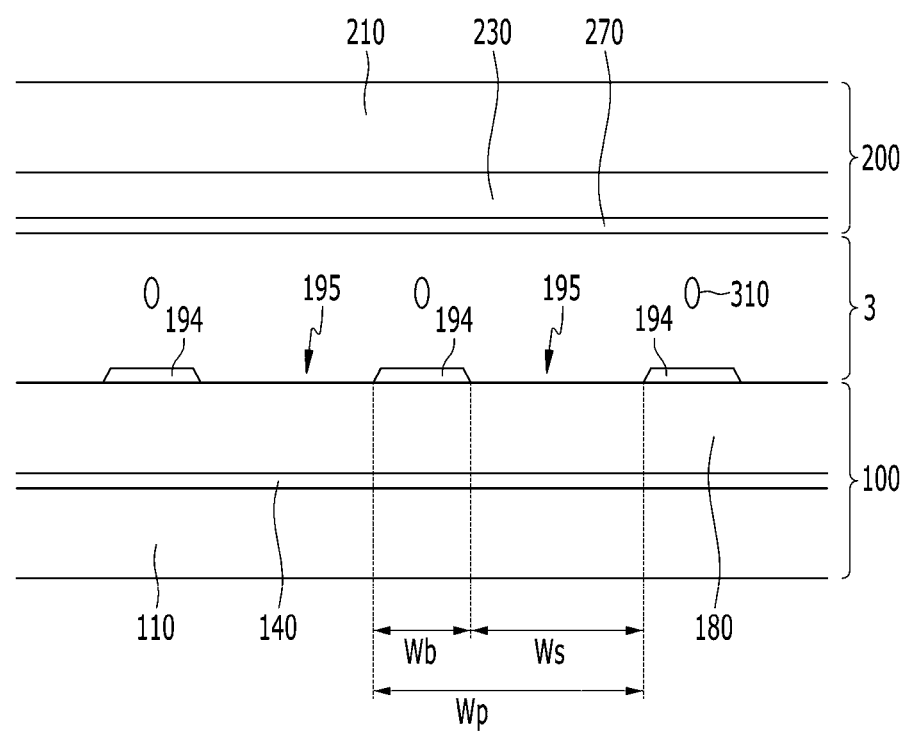
FIG. 8 is a cross-sectional view taken along the line VIII-VIII of FIG. 7.

As shown FIG. 7 and FIG. 8, the pixel electrode 191 includes a plurality of fine branches 194 and fine slits 195 disposed between the fine branches 194.

A width Wb of the fine branches 194, a space Ws between the fine branches 194, and a pitch Wp of the pixel electrode 191 may be constant in one subpixel.

The width Wb of the fine branches 194 of the subpixel shown in FIG. 7 and FIG. 8 is narrower than the width Wb of the fine branch 194 of the subpixel shown in FIG. 5 and FIG. 6. In this case, the space Ws between the fine branches 194 of the subpixel shown in FIG. 7 and FIG. 8 is wider than the space Ws between the fine branches 194 of the subpixel shown in FIG. 5 and FIG. 6. The pitch Wp of the pixel electrode 191 of the subpixel shown in FIG. 7 and FIG. 8 is substantially the same as the pitch Wp of the pixel electrode 191 of the subpixel shown in FIG. 5 and FIG. 6.

The wider the width Wb of the fine branch 194, the higher the luminance of the subpixel, and the narrower the space Ws between the fine branches 194, the higher the luminance of the corresponding subpixel. Thus, luminance of the subpixel shown in FIG. 7 and FIG. 8 may be lower than luminance of the subpixel shown in FIG. 5 and FIG. 6.

For example, the first subpixel PX1r of the first pixel PX1, and the first subpixel PX2r, the second subpixel PX2g, and the third subpixel PX2b of the second pixel PX2 may have pixel electrode layout shown in FIG. 5 and FIG. 6, while the second subpixel PX1g and the third subpixel PX1b of the first pixel PX1 may have the pixel electrode layout shown in FIG. 7 and FIG. 8.

A portion of the first subpixel PX1r overlapping the outside light blocking member 220a is covered by the outside light blocking member 220a so that luminance of that portion becomes lower. In a general display device, luminance of the first subpixel PX1r of the first pixel PX1 becomes lower than luminance of the second subpixel PX1g and of the third subpixel PX1b of the first pixel PX1, so that a color shift is generated. In the present exemplary embodiment, a width Wb of the fine branches 194 of the second subpixel PX1g and the third subpixel PX1b of the first pixel PX1 is narrower than a width Wb of the fine branches of the first subpixel PX1r of the first pixel PX1, so that luminance of the second subpixel PX1g and the third subpixel PX1b of the first pixel PX1 may be lower than luminance of the first subpixel PX1r of the first pixel PX1. Thus, it is possible to prevent color shift from being generated in the first pixel PX1.

In this case, a space Ws between the fine branches 194 of the second subpixel PX1g and third subpixel PX1b of first pixel PX1 may be wider than a space Ws between the fine branches 194 of the first subpixel PX1r of the first pixel PX1. A width Wb of the fine branches 194 of the second subpixel PX1g and the third subpixel PX1b of the first pixel PX1 is narrower than a width Wb of the fine branches 194 of the second pixel PX2. A space Ws between the fine branches 194 of the second subpixel PX1g and the third subpixel PX1b of the first pixel PX1 may be wider than a space Ws between the fine branches 194 of the second pixel PX2. A width Wb of the fine branches 194 of the first subpixel PX1r of the first pixel PX1 is substantially the same as the width Wb of the fine branches 194 of the second pixel PX2. A space Ws between the fine branches 194 of the first subpixel PX1r of the first pixel PX1 is substantially the same as a space Ws between the fine branches 194 of the second pixel PX2.

A pitch Wp of the pixel electrode 191 of the first pixel PX1 and a pitch Wp of the pixel electrode 191 of the second pixel PX2 are substantially the same.

The first subpixel PX3r of the third pixel PX3 overlaps the outside light blocking member 220a, so that luminance of the first subpixel PX3r of the third pixel PX3 becomes lower. By narrowing a width Wb of the fine branches 194 of the second subpixel PX3g and third subpixel PX3b of the third pixel PX3, it is possible to prevent color shift from being generated in the third pixel PX3. In this case, a width Wb of the fine branches 194 of the second subpixel PX3g and the third subpixel PX3b of the third pixel PX3 is narrower than a width Wb of the fine branches 194 of the first subpixel PX3r of the third pixel PX3 and the fourth pixel PX4. Further, a space Ws between the fine branches 194 of the second subpixel PX3g and the third subpixel PX3b of the third pixel PX3 may be wider than a space Ws between the fine branches 194 of the first subpixel PX3r of the third pixel PX3 and the fourth pixel PX4.

An area of overlap between the first subpixel PX3r of the third pixel PX3 and the outside light blocking member 220a is smaller than an area of overlap between the first subpixel PX1r of the first pixel PX1 and the outside light blocking member 220a. Thus, a decrement of luminance of the first subpixel PX3r of the third pixel PX3 is lower than a decrement of luminance of the first subpixel PX1r of the first pixel PX1. Thus, a width Wb of the fine branches 194 of the second subpixel PX3g and the third subpixel PX3b of the third pixel PX3 may be wider than a width Wb of the fine branches 194 of the second subpixel PX1g and the third subpixel PX1b of the first pixel PX1. That is, a width Wb of the fine branch 194 may be controlled by considering a decrement of luminance according to an area of overlap between the corresponding subpixel and the outside light blocking member 220a.

The first subpixel PX5r of the fifth pixel PX5 overlaps the outside light blocking member 220a, so that luminance of the first subpixel PX5r of the fifth pixel PX5 becomes lower. By narrowing a width Wb of the fine branches 194 of the second subpixel PX5g and the third subpixel PX5b of the fifth pixel PX5, it is possible to prevent color shift from being generated in the fifth pixel PX5. In this case, a width Wb of the fine branches 194 of the second subpixel PX5g and the third subpixel PX5b of the fifth pixel PX5 is narrower than a width Wb of the fine branches 194 of the first subpixel PX5r of the fifth pixel PX5 and the sixth pixel PX6. Further, a space Ws between the fine branches 194 of the second subpixel PX5g and the third subpixel PX5b of the fifth pixel PX5 may be wider than a space Ws between the fine branches 194 of the first subpixel PX5r of the fifth pixel PX5 and the sixth pixel PX6.

An area of overlap between the first subpixel PX5r of the fifth pixel PX5 and the outside light blocking member 220a is smaller than an area of overlap between the first subpixel PX3r of the third pixel PX3 and the outside light blocking member 220a. Thus, a decrement of luminance of the first subpixel PX5r of the fifth pixel PX5 is lower than a decrement of luminance of the first subpixel PX3r of the third pixel PX3. Thus, a width Wb of the fine branches 194 of the second subpixel PX5g and the third subpixel PX5b of the fifth pixel PX5 may be wider than a width Wb of the fine branches 194 of the second subpixel PX3g and the third subpixel PX3b of the third pixel PX3. That is, a width Wb of the fine branches 194 may be controlled by considering a decrement of luminance according to an area of overlap between the corresponding subpixel and the outside light blocking member 220a.

The first subpixel PX7r of the seventh pixel PX7 overlaps the outside light blocking member 220a so that luminance of the first subpixel PX7r of the seventh pixel PX7 becomes lower. Thus, by narrowing a width Wb of the fine branches 194 of the second subpixel PX7g and the third subpixel PX7b of the seventh pixel PX7, it is possible to prevent the color shift from being generated in the seventh pixel PX7. In this case, a width Wb of the fine branches 194 of the second subpixel PX7g and the third subpixel PX7b of the seventh pixel PX7 is narrower than a width Wb of the fine branches 194 of the first subpixel PX7r of the seventh pixel PX7 and the eighth pixel PX8. Further, a space Ws between the fine branches 194 of the second subpixel PX7g and the third subpixel PX7b of the seventh pixel PX7 may be wider than a space Ws between the fine branches 194 of the first subpixel PX7r of the seventh pixel PX7 and the eighth pixel PX8.

An area of overlap between the first subpixel PX7r of the seventh pixel PX7 and the outside light blocking member 220a is smaller than an area of overlap between the first subpixel PX5r of the fifth pixel PX5 and the outside light blocking member 220a. Thus, a decrement of luminance of the first subpixel PX7r of the seventh pixel PX7 is lower than a decrement of luminance of the first subpixel PX5r of the fifth pixel PX5. Thus, a width Wb of the fine branches 194 of the second subpixel PX7g and the third subpixel PX7b of the seventh pixel PX7 may be wider than a width Wb of the fine branches 194 of the second subpixel PX5g and the third subpixel PX5b of the fifth pixel PX5. That is, a width Wb of the fine branches 194 may be controlled by considering a decrement of luminance according to an area of overlap between the corresponding subpixel and the outside light blocking member 220a.

Next, a display device according to an exemplary embodiment will be described with reference to FIG. 9 and FIG. 10.

The present exemplary embodiment is similar to the display device according to the exemplary embodiment shown in FIG. 1 to FIG. 8 such that redundant description thereof is omitted. In the present exemplary embodiment, by increasing luminance of a subpixel overlapping the light blocking member, a decrement of the luminance of the subpixel may be compensated differently from the previous exemplary embodiment, and this will be described in detail.

Figure 9:
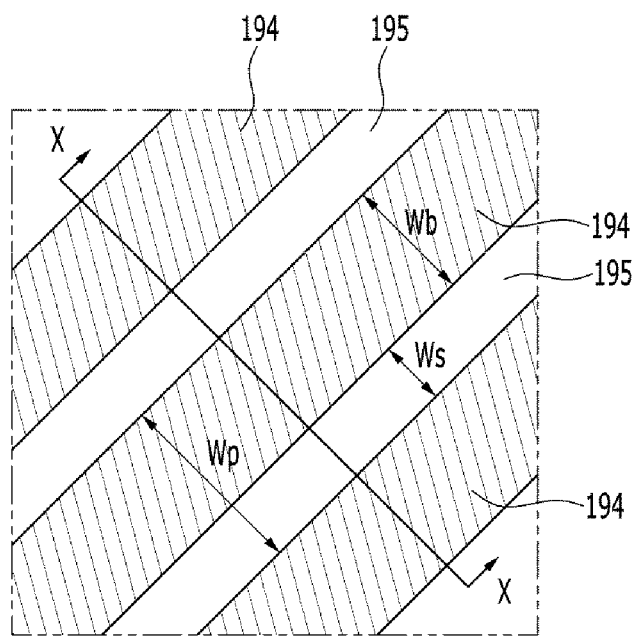
FIG. 9 is a top plan view showing a portion of a pixel electrode of a subpixel of a display device according to an exemplary embodiment.
Figure 10:
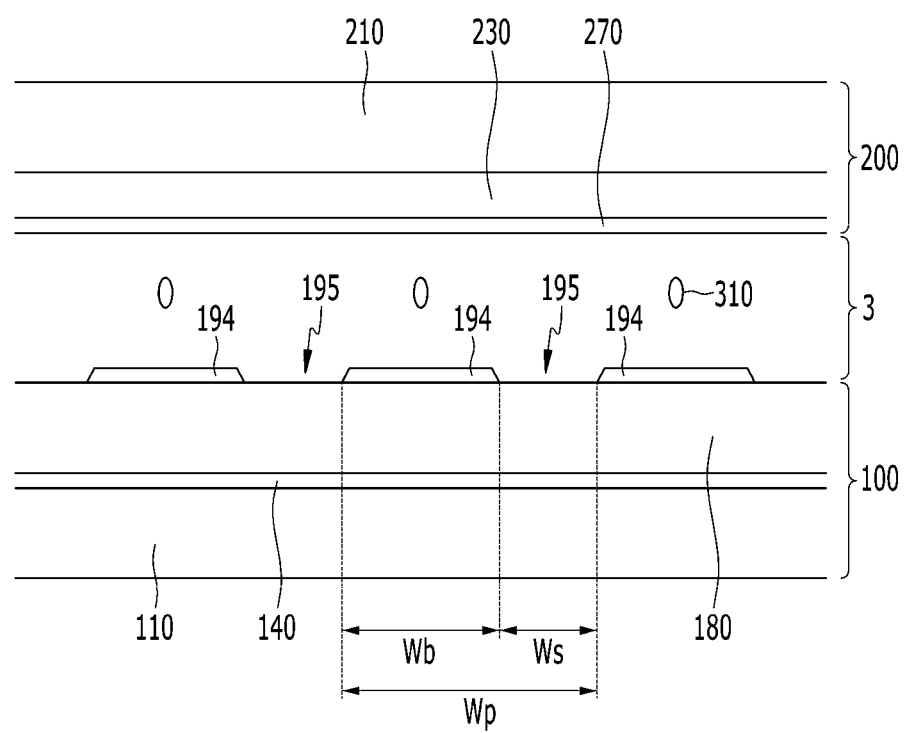
FIG. 10 is a cross-sectional view taken along the line X-X of FIG. 9.

FIG. 9 is a top plan view showing a portion of a pixel electrode of a subpixel of a display device according to an exemplary embodiment, and FIG. 10 is a cross-sectional view taken along the line X-X of FIG. 9.

As shown FIG. 9 and FIG. 10, the pixel electrode 191 includes a plurality of fine branches 194 and a fine slit 195 disposed between the plurality of fine branches 194.

The width Wb of each fine branch 194, the space Ws between the fine branches 194, and the pitch Wp of the pixel electrode 191 may be constant in one subpixel.

The width Wb of the fine branches 194 of the subpixel shown in FIG. 9 and FIG. 10 is greater than the width Wb of the fine branches 194 of the subpixel shown in FIG. 5 and FIG. 6. In this case, the space Ws between the fine branches 194 of the subpixel shown in FIG. 9 and FIG. 10 is narrower than the space Ws between the fine branches 194 of the subpixel shown in FIG. 5 and FIG. 6. Further, the pitch Wp of the pixel electrode 191 of the subpixel shown in FIG. 9 and FIG. 10 is substantially the same as the pitch Wp of the pixel electrode 191 of the subpixel shown in FIG. 5 and FIG. 6.

The wider the width Wb of the fine branch 194, the higher the luminance of the subpixel, and the narrower the space Ws between the fine branches 194, the higher the luminance of the corresponding subpixel. Thus, luminance of the subpixel shown in FIG. 9 and FIG. 10 may be greater than luminance of the subpixel shown in FIG. 5 and FIG. 6.

For example, the second subpixel PX1g and the third subpixel PX1b of the first pixel PX1, and the first subpixel PX2r, the second subpixel PX2g, and the third subpixel PX2b of the second pixel PX2 may have a shape of a subpixel shown in FIG. 5 and FIG. 6, and the first subpixel PX1r of the first pixel PX1 may have a shape of a subpixel shown in FIG. 9 and FIG. 10.

A portion of the first subpixel PX1r of the first pixel PX1 overlapping the outside light blocking member 220a is covered by the outside light blocking member 220a, so that luminance of the portion becomes lower. In a general display device, luminance of the first subpixel PX1r of the first pixel PX1 becomes lower than luminance of the second subpixel PX1g and the third subpixel PX1b of the first pixel PX1, so that a color shift is generated. In the present exemplary embodiment, a width Wb of the fine branches 194 of the first subpixel PX1r of the first pixel PX1 is wider than a width Wb of the fine branches of the second subpixel PX1g and the third subpixel PX1b of the first pixel PX1, so that luminance of the first subpixel PX1r of the first pixel PX1 becomes higher than luminance of the second subpixel PX1g and the third subpixel PX1b of the first pixel PX1. Thus, it is possible to prevent the color shift from being generated in the first pixel PX1. Further, luminance of the first pixel PX1 overlapping the outside light blocking member 220a may be maintained at a level similar to luminance of the second pixel PX2, thus the rounded edge of the display device may be prevented from being represented as a step shape.

In this case, a space Ws between the fine branches 194 of the first subpixel PX1r of first pixel PX1 may be narrower than a space Ws between the fine branches 194 of the second subpixel PX1g and third subpixel PX1b of the first pixel PX1. A width Wb of the fine branches 194 of the first subpixel PX1r of the first pixel PX1 is wider than a width Wb of the fine branches 194 of the second pixel PX2. A space Ws between the fine branches 194 of the first subpixel PX1r of the first pixel PX1 may be narrower than a space Ws between the fine branches 194 of the second pixel PX2. A width Wb of the fine branches 194 of the second subpixel PX1g and the third subpixel PX1b of the first pixel PX1 is substantially the same as the width Wb of the fine branches 194 of the second pixel PX2. A space Ws between the fine branches 194 of the second subpixel PX1g and the third subpixel PX1b of the first pixel PX1 is substantially the same as a space Ws between the fine branches 194 of the second pixel PX2.

A pitch Wp of the pixel electrode 191 of the first pixel PX1 and a pitch Wp of the pixel electrode 191 of the second pixel PX2 are substantially the same.

The first subpixel PX3r of the third pixel PX3 overlaps the outside light blocking member 220a, so that luminance of the first subpixel PX3r of the third pixel PX3 becomes lower. By widening a width Wb of the fine branches 194 of the first subpixel PX3r of the third pixel PX3, it is possible to prevent the color shift from being generated in the third pixel PX3. In this case, a width Wb of the fine branches 194 of the first subpixel PX3r of the third pixel PX3 is wider than a width Wb of the fine branches 194 of the second subpixel PX3g and the third subpixel PX3b of the third pixel PX3 and the fourth pixel PX4. Further, a space Ws between the fine branches 194 of the first subpixel PX3r of the third pixel PX3 may be narrower than a space Ws between the fine branches 194 of the second subpixel PX3g and the third subpixel PX3b of the third pixel PX3 and the fourth pixel PX4.

An area of overlap between the first subpixel PX3r of the third pixel PX3 and the outside light blocking member 220a is smaller than an area of overlap between the first subpixel PX1r of the first pixel PX1 and the outside light blocking member 220a. Thus, a decrement of luminance of the first subpixel PX3r of the third pixel PX3 is lower than a decrement of luminance of the first subpixel PX1r of the first pixel PX1. Thus, a width Wb of the fine branches 194 of the first subpixel PX3r of the third pixel PX3 may be narrower than a width Wb of the fine branches 194 of the first subpixel PX1r of the first pixel PX1. That is, a width Wb of the fine branches 194 may be controlled by considering a decrement of luminance according to an area of overlap between the corresponding subpixel and the outside light blocking member 220a.

The first subpixel PX5r of the fifth pixel PX5 overlaps the outside light blocking member 220a, so that luminance of the first subpixel PX5r of the fifth pixel PX5 becomes lower. By widening a width Wb of the fine branches 194 of the first subpixel PX5r of the fifth pixel PX5, it is possible to prevent the color shift from being generated in the fifth pixel PX5. In this case, a width Wb of the fine branches 194 of the first subpixel PX5r of the fifth pixel PX5 is wider than a width Wb of the fine branches 194 of the second subpixel PX5g and the third subpixel PX5b of the fifth pixel PX5 and the sixth pixel PX6. Further, a space Ws between the fine branches 194 of the first subpixel PX5r of the fifth pixel PX5 may be narrower than a space Ws between the fine branches 194 of the second subpixel PX5g and the third subpixel PX5b of the fifth pixel PX5 and the sixth pixel PX6.

An area of overlap between the first subpixel PX5r of the fifth pixel PX5 and the outside light blocking member 220a is smaller than an area of overlap between the first subpixel PX3r of the third pixel PX3 and the outside light blocking member 220a. Thus, a decrement of luminance of the first subpixel PX5r of the fifth pixel PX5 is lower than a decrement of luminance of the first subpixel PX3r of the third pixel PX3. Thus, a width Wb of the fine branches 194 of the first subpixel PX5r of the fifth pixel PX5 may be narrower than a width Wb of the fine branches 194 of the first subpixel PX3r of the third pixel PX3. That is, a width Wb of the fine branches 194 may be controlled by considering a decrement of luminance according to an overlapping area of the corresponding subpixel and the outside light blocking member 220a.

The first subpixel PX7r of the seventh pixel PX7 overlaps the outside light blocking member 220a, so that luminance of the first subpixel PX7r of the seventh pixel PX7 becomes lower. By widening a width Wb of the fine branches 194 of the first subpixel PX7r of the seventh pixel PX7, it is possible to prevent the color shift from being generated in the seventh pixel PX7. In this case, a width Wb of the fine branches 194 of the first subpixel PX7r of the seventh pixel PX7 is wider than a width Wb of the fine branches 194 of the second subpixel PX7g and the third subpixel PX7b of the seventh pixel PX7 and the eighth pixel PX8. Further, a space Ws between the fine branches 194 of the first subpixel PX7r of the seventh pixel PX7 may be narrower than a space Ws between the fine branches 194 of the second subpixel PX7g and the third subpixel PX7b of the seventh pixel PX7 and the eighth pixel PX8.

An area of overlap between the first subpixel PX7r of the seventh pixel PX7 and the outside light blocking member 220a is smaller than an area of overlap between the first subpixel PX5r of the fifth pixel PX5 and the outside light blocking member 220a. Thus, a decrement of luminance of the first subpixel PX7r of the seventh pixel PX7 is lower than a decrement of luminance of the first subpixel PX5r of the fifth pixel PX5. Thus, a width Wb of the fine branches 194 of the first subpixel PX7r of the seventh pixel PX7 may be narrower than a width Wb of the fine branches 194 of the first subpixel PX5r of the fifth pixel PX5. That is, a width Wb of the fine branches 194 may be controlled by considering a decrement of luminance according to an overlapping area of the corresponding subpixel and the outside light blocking member 220a.

Next, a display device according to an exemplary embodiment will be described with reference to FIG. 11 and FIG. 12.

The present exemplary embodiment is similar to the display device according to the exemplary embodiment shown in FIG. 1 to FIG. 8 such that redundant description thereof is omitted. In the present exemplary embodiment, by adjusting an angle between the fine branches and the horizontal stem, luminance of the corresponding subpixel may be controlled differently from the previous exemplary embodiment, as will be described in further detail below.

Figure 11:
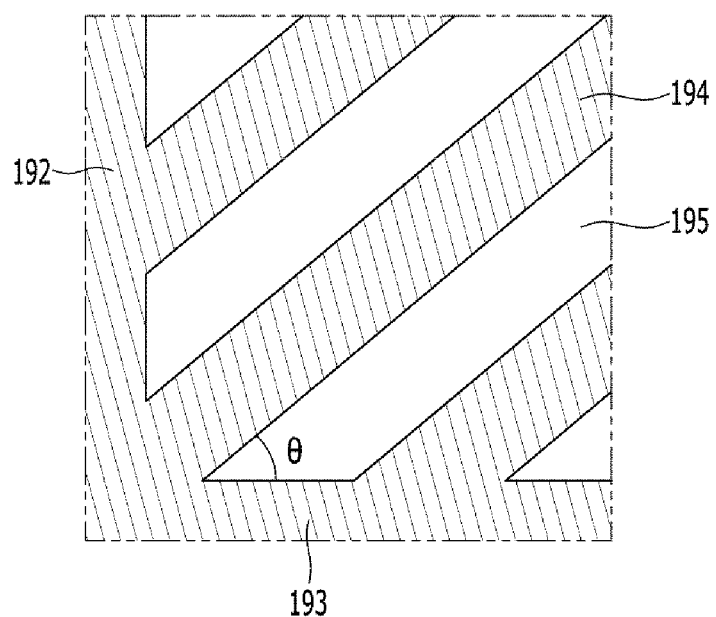
FIG. 11 is a top plan view showing a portion of a pixel electrode of one subpixel of a display device according to an exemplary embodiment.
Figure 12:
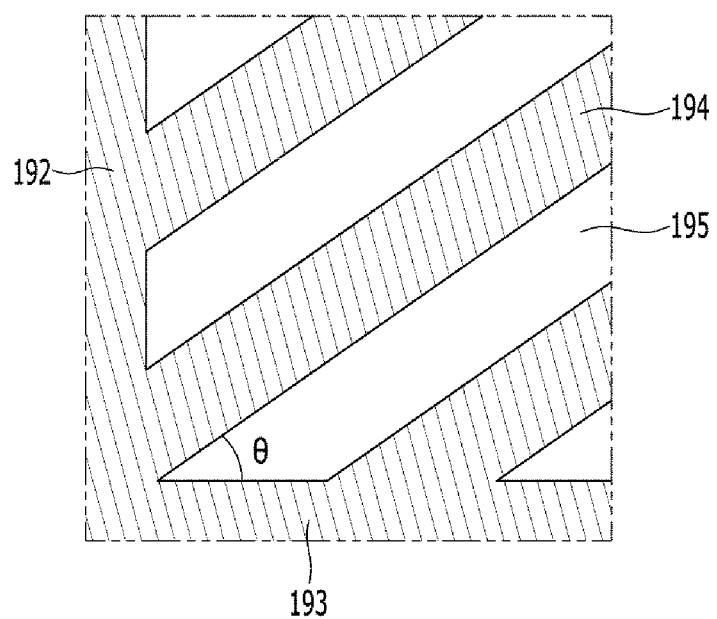
FIG. 12 is a top plan view showing a portion of a pixel electrode of another subpixel of a display device according to an exemplary embodiment.

FIG. 11 is a top plan view showing a portion of a pixel electrode of one subpixel of a display device according to an exemplary embodiment, and FIG. 12 is a top plan view showing a portion of a pixel electrode of another subpixel of a display device according to an exemplary embodiment.

As shown FIG. 11 and FIG. 12, the pixel electrode 191 includes a horizontal stem 193, a vertical stem 192, and a plurality of fine branches 194 extending therefrom. A fine slit 195 is formed between pairs of fine branches 194. The fine branches 194 are inclined with respect to the horizontal stem 193, to form a predetermined angle between the fine branches 194 and the horizontal stem 193.

An angle θ between the horizontal stem 193 and the fine branches 194 in FIG. 12 is smaller than an angle θ between the horizontal stem 193 and the fine branches 194 in FIG. 11. For example, an angle θ between the horizontal stem 193 and the fine branches 194 in FIG. 11 may be about 40 degrees, and an angle θ between the horizontal stem 193 and the fine branches 194 in FIG. 12 may be about 35 degrees. The closer an angle θ is to 45 degrees, the higher the luminance of the corresponding subpixel is. Thus, luminance of a subpixel shown in FIG. 12 may be lower than luminance of a subpixel shown in FIG. 11.

For example, the first subpixel PX1r of the first pixel PX1, and the first subpixel PX2r, the second subpixel PX2g, and the third subpixel PX2b of the second pixel PX2 may have a shape of a subpixel shown in FIG. 11, and the second subpixel PX1g and the third subpixel PX1b of the first pixel PX1 may have a shape of a subpixel shown in FIG. 12.

A portion of the first subpixel PX1r of the first pixel PX1 is covered by the outside light blocking member 220a, so that luminance of that portion becomes lower. In a general display device, luminance of the first subpixel PX1r of the first pixel PX1 becomes lower than luminance of the second subpixel PX1g and the third subpixel PX1b of the first pixel PX1, so that a color shift is generated. In the present exemplary embodiment, an angle θ between the horizontal stem 193 and the fine branches 194 disposed in the second subpixel PX1g and the third subpixel PX1b of the first pixel PX1 is smaller than an angle θ between the horizontal stem 193 and the fine branches 194 disposed in the first subpixel PX1r of the first pixel PX1, so that luminance of the second subpixel PX1g and the third subpixel PX1b of the first pixel PX1 may become lower than luminance of the first subpixel PX1r of the first pixel PX1. Thus, it is possible to prevent color shift from being generated in the first pixel PX1.

In this case, an angle θ between the horizontal stem 193 and the fine branches 194 disposed in the second subpixel PX1g and the third subpixel PX1b of the first pixel PX1 is smaller than an angle θ between the horizontal stem 193 and the fine branches 194 disposed in the second pixel PX2. An angle θ between the horizontal stem 193 and the fine branches 194 disposed in the first subpixel PX1r of the first pixel PX1 may be substantially the same as an angle θ between the horizontal stem 193 and the fine branches 194 disposed in the second pixel PX2.

The first subpixel PX3r of the third pixel PX3 overlaps the outside light blocking member 220a, so that luminance of the first subpixel PX3r of the third pixel PX3 becomes lower. By increasing an angle θ between the horizontal stem 193 and the fine branches 194 disposed in the second subpixel PX3g and third subpixel PX3b of the third pixel PX3, it is possible to prevent color shift from being generated in the third pixel PX3. In this case, an angle θ between the horizontal stem 193 and the fine branches 194 disposed in the second subpixel PX3g and the third subpixel PX3b of the third pixel PX3 is smaller than an angle θ between the horizontal stem 193 and the fine branches 194 disposed in the first subpixel PX3r of the third pixel PX3 and the fourth pixel PX4.

An area of overlap between the first subpixel PX3r of the third pixel PX3 and the outside light blocking member 220a is smaller than an area of overlap between the first subpixel PX1r of the first pixel PX1 and the outside light blocking member 220a. Thus, a decrement of luminance of the first subpixel PX3r of the third pixel PX3 is lower than a decrement of luminance of the first subpixel PX1r of the first pixel PX1. Thus, an angle θ between the horizontal stem 193 and the fine branches 194 disposed in the second subpixel PX3g and the third subpixel PX3b of the third pixel PX3 may be greater than an angle θ between the horizontal stem 193 and the fine branches 194 disposed in the second subpixel PX1g and the third subpixel PX1b of the first pixel PX1. That is, an angle θ between the horizontal stem 193 and the fine branches 194 may be controlled by considering a decrement of luminance according to an area of overlap between the corresponding subpixel and the outside light blocking member 220a.

The first subpixel PX5r of the fifth pixel PX5 overlaps the outside light blocking member 220a, so that luminance of the first subpixel PX5r of the fifth pixel PX5 becomes lower. By decreasing an angle θ between the horizontal stem 193 and the fine branches 194 disposed in the second subpixel PX5g and the third subpixel PX5b of the fifth pixel PX5, it is possible to prevent color shift from being generated in the fifth pixel PX5. In this case, an angle θ between the horizontal stem 193 and the fine branches 194 disposed in the second subpixel PX5g and the third subpixel PX5b of the fifth pixel PX5 is smaller than an angle θ between the horizontal stem 193 and the fine branches 194 disposed in the first subpixel PX5r of the fifth pixel PX5 and the sixth pixel PX6.

An area of overlap between the first subpixel PX5r of the fifth pixel PX5 and the outside light blocking member 220a is smaller than an area of overlap between the first subpixel PX3r of the third pixel PX3 and the outside light blocking member 220a. Thus, a decrement of luminance of the first subpixel PX5r of the fifth pixel PX5 is lower than a decrement of luminance of the first subpixel PX3r of the third pixel PX3. Thus, an angle θ between the horizontal stem 193 and the fine branches 194 disposed in the second subpixel PX5g and the third subpixel PX5b of the fifth pixel PX5 may be greater than an angle θ between the horizontal stem 193 and the fine branches 194 disposed in the second subpixel PX3g and the third subpixel PX3b of the third pixel PX3. That is, an angle θ between the horizontal stem 193 and the fine branches 194 may be controlled by considering a decrement of luminance according to an area of overlap between the corresponding subpixel and the outside light blocking member 220a.

The first subpixel PX7r of the seventh pixel PX7 overlaps the outside light blocking member 220a, so that luminance of the first subpixel PX7r of the seventh pixel PX7 becomes lower. By decreasing an angle θ between the horizontal stem 193 and the fine branches 194 disposed in the second subpixel PX7g and the third subpixel PX7b of the seventh pixel PX7, it is possible to prevent color shift from being generated in the seventh pixel PX7. In this case, an angle θ between the horizontal stem 193 and the fine branches 194 disposed in the second subpixel PX7g and the third subpixel PX7b of the seventh pixel PX7 is smaller than an angle θ between the horizontal stem 193 and the fine branches 194 disposed in the first subpixel PX7r of the seventh pixel PX7 and the eighth pixel PX8.

An area of overlap between the first subpixel PX7r of the seventh pixel PX7 and the outside light blocking member 220a is smaller than an area of overlap between the first subpixel PX5r of the fifth pixel PX5 and the outside light blocking member 220a. Thus, a decrement of luminance of the first subpixel PX7r of the seventh pixel PX7 is lower than a decrement of luminance of the first subpixel PX5r of the fifth pixel PX5. Thus, an angle θ between the horizontal stem 193 and the fine branches 194 disposed in the second subpixel PX7g and the third subpixel PX7b of the seventh pixel PX7 may be greater than an angle θ between the horizontal stem 193 and the fine branches 194 disposed in the second subpixel PX5g and the third subpixel PX5b of the fifth pixel PX5. That is, an angle θ between the horizontal stem 193 and the fine branches 194 may be controlled by considering a decrement of luminance according to an area of overlap between the corresponding subpixel and the outside light blocking member 220a.

Next, a display device according to an exemplary embodiment will be described with reference to FIG. 13.

The present exemplary embodiment is similar to the display device according to the exemplary embodiment shown in FIG. 11 and FIG. 12 such that redundant description thereof is omitted. In the present exemplary embodiment, by increasing an angle between the horizontal stem and the fine branches disposed in the subpixels overlapping the light blocking member, a decrement of the luminance of the subpixel may be compensated differently from the previous exemplary embodiment, and this will be described in further detail below.

Figure 13:
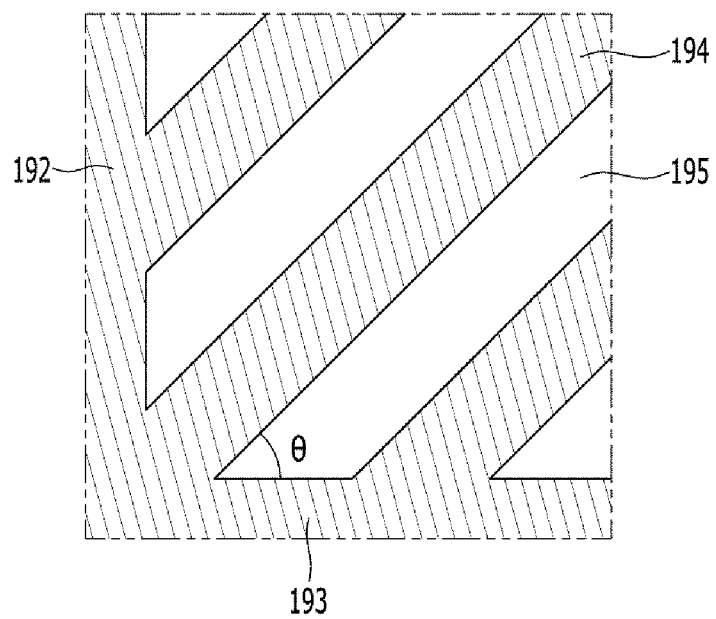
FIG. 13 is a top plan view showing a portion of a pixel electrode of a subpixel of a display device according to an exemplary embodiment.

FIG. 13 is a top plan view showing a portion of a pixel electrode of a subpixel of a display device according to an exemplary embodiment.

As shown in FIG. 13, the pixel electrode 191 includes a horizontal stem 193, a vertical stem 192, and a plurality of fine branches 194 extending therefrom. Fine slits 195 are formed between adjacent fine branches 194. The fine branches 194 are inclined with respect to the horizontal stem 193 to, form a predetermined angle θ between the fine branches 194 and the horizontal stem 193.

An angle θ between the horizontal stem 193 and the fine branches 194 in FIG. 13 is greater than an angle θ between the horizontal stem 193 and the fine branches 194 in FIG. 11. For example, an angle θ between the horizontal stem 193 and the fine branches 194 in FIG. 11 may be about 40 degrees, and an angle θ between the horizontal stem 193 and the fine branches 194 in FIG. 13 may be about 45 degrees.

The closer an angle θ between the horizontal stem 193 and the fine branches 194 is to 45 degrees, the higher the luminance of the corresponding subpixel is. Thus, luminance of a subpixel shown in FIG. 13 may be higher than luminance of a subpixel shown in FIG. 11.

For example, the second subpixel PX1g and third subpixel PX1b of the first pixel PX1, and the first subpixel PX2r, the second subpixel PX2g, and the third subpixel PX2b of the second pixel PX2 may have a shape of a subpixel shown in FIG. 11, and the first subpixel PX1r of the first pixel PX1 may have a shape of a subpixel shown in FIG. 13.

A portion of the first subpixel PX1r of the first pixel PX1 is covered by the outside light blocking member 220a, so that luminance of the portion becomes lower. In a general display device, luminance of the first subpixel PX1r of the first pixel PX1 becomes lower than luminance of the second subpixel PX1g and the third subpixel PX1b of the first pixel PX1, so that a color shift is generated. In the present exemplary embodiment, an angle θ between the horizontal stem 193 and the fine branches 194 disposed in the first subpixel PX1r of the first pixel PX1 is greater than an angle θ between the horizontal stem 193 and the fine branches 194 disposed in the second subpixel PX1g and the third subpixel PX1b of the first pixel PX1, so that luminance of the first subpixel PX1r of the first pixel PX1 may be greater than luminance of the second subpixel PX1g and the third subpixel PX1b of the first pixel PX1. Thus, it is possible to prevent color shift from being generated in the first pixel PX1. Further, luminance of the first pixel PX1 overlapping the outside light blocking member 220a may be maintained at a level similar to luminance of the second pixel PX2, thus the rounded edge of the display device may be prevented from being represented as a step shape.

In this case, an angle θ between the horizontal stem 193 and the fine branches 194 disposed in the first subpixel PX1r of the first pixel PX1 is larger than an angle θ between the horizontal stem 193 and the fine branches 194 disposed in the second pixel PX2. An angle θ between the horizontal stem 193 and the fine branches 194 disposed in the second subpixel PX1g and the third subpixel PX1b of the first pixel PX1 may be substantially the same as an angle θ between the horizontal stem 193 and the fine branches 194 disposed in the second pixel PX2.

The first subpixel PX3r of the third pixel PX3 overlaps the outside light blocking member 220a, so that luminance of the first subpixel PX3r of the third pixel PX3 becomes lower. By increasing an angle θ between the horizontal stem 193 and the fine branches 194 disposed in the first subpixel PX3r of the third pixel PX3, it is possible to prevent color shift from being generated in the third pixel PX3. In this case, an angle θ between the horizontal stem 193 and the fine branches 194 disposed in the first subpixel PX3r of the third pixel PX3 is greater than an angle θ between the horizontal stem 193 and the fine branches 194 disposed in the second and third subpixels PX3g and PX3b of the third pixel PX3 and the fourth pixel PX4.

An area of overlap between the first subpixel PX3r of the third pixel PX3 and the outside light blocking member 220a is smaller than an area of overlap between the first subpixel PX1r of the first pixel PX1 and the outside light blocking member 220a. Thus, a decrement of luminance of the first subpixel PX3r of the third pixel PX3 is lower than a decrement of luminance of the first subpixel PX1r of the first pixel PX1. Thus, an angle θ between the horizontal stem 193 and the fine branches 194 disposed in the first subpixel PX3r of the third pixel PX3 may be smaller than an angle θ between the horizontal stem 193 and the fine branches 194 disposed in the first subpixel PX1r of the first pixel PX1. That is, an angle θ between the horizontal stem 193 and the fine branches 194 may be controlled by considering a decrement of luminance according to an overlapping area of the corresponding subpixel and the outside light blocking member 220a.

The first subpixel PX5r of the fifth pixel PX5 overlaps the outside light blocking member 220a, so that luminance of the first subpixel PX5r of the fifth pixel PX5 becomes lower. By increasing an angle θ between the horizontal stem 193 and the fine branches 194 disposed in the first subpixel PX5r of the fifth pixel PX5, it is possible to prevent color shift from being generated in the fifth pixel PX5. In this case, an angle θ between the horizontal stem 193 and the fine branches 194 disposed in the first subpixel PX5r of the fifth pixel PX5 is greater than an angle θ between the horizontal stem 193 and the fine branches 194 disposed in the second subpixel PX5g and the third subpixel PX5b of the fifth pixel PX5 and the sixth pixel PX6.

An area of overlap between the first subpixel PX5r of the fifth pixel PX5 and the outside light blocking member 220a is smaller than an area of overlap between the first subpixel PX3r of the third pixel PX3 and the outside light blocking member 220a. Thus, a decrement of luminance of the first subpixel PX5r of the fifth pixel PX5 is lower than a decrement of luminance of the first subpixel PX3r of the third pixel PX3. Thus, an angle θ between the horizontal stem 193 and the fine branches 194 disposed in the first subpixel PX5r of the fifth pixel PX5 may be smaller than an angle θ between the horizontal stem 193 and the fine branches 194 disposed in the first subpixel PX3r of the third pixel PX3. That is, an angle θ between the horizontal stem 193 and the fine branches 194 may be controlled by considering a decrement of luminance according to an area of overlap between the corresponding subpixel and the outside light blocking member 220a.

The first subpixel PX7r of the seventh pixel PX7 overlaps the outside light blocking member 220a, so that luminance of the first subpixel PX7r of the seventh pixel PX7 becomes lower. By increasing an angle θ between the horizontal stem 193 and the fine branches 194 disposed in the first subpixel PX7r of the seventh pixel PX7, it is possible to prevent color shift from being generated in the seventh pixel PX7. In this case, an angle θ between the horizontal stem 193 and the fine branches 194 disposed in the first subpixel PX7r of the seventh pixel PX7 is greater than an angle θ between the horizontal stem 193 and the fine branches 194 disposed in the second subpixel PX7g and the third subpixel PX7b of the seventh pixel PX7 and the eighth pixel PX8.

An area of overlap between the first subpixel PX7r of the seventh pixel PX7 and the outside light blocking member 220a is smaller than an area of overlap between the first subpixel PX5r of the fifth pixel PX5 and the outside light blocking member 220a. Thus, a decrement of luminance of the first subpixel PX7r of the seventh pixel PX7 is lower than a decrement of luminance of the first subpixel PX5r of the fifth pixel PX5. Thus, an angle θ between the horizontal stem 193 and the fine branches 194 disposed in the first subpixel PX7r of the seventh pixel PX7 may be smaller than an angle θ between the horizontal stem 193 and the fine branches 194 disposed in the first subpixel PX5r of the fifth pixel PX5. That is, an angle θ between the horizontal stem 193 and the fine branches 194 may be controlled by considering a decrement of luminance according to an overlapping area of the corresponding subpixel and the outside light blocking member 220a.

Next, a display device according to an exemplary embodiment will be described with reference to FIG. 14.

The present exemplary embodiment is similar to the display device according to the exemplary embodiment shown in FIG. 1 to FIG. 8 such that repetitive description thereof is omitted. In the present exemplary embodiment, a size of a pixel disposed on an edge of the display device is different from a size of a pixel adjacent thereto, different from the previous exemplary embodiment, and this will now be described in further detail.

Figure 14:
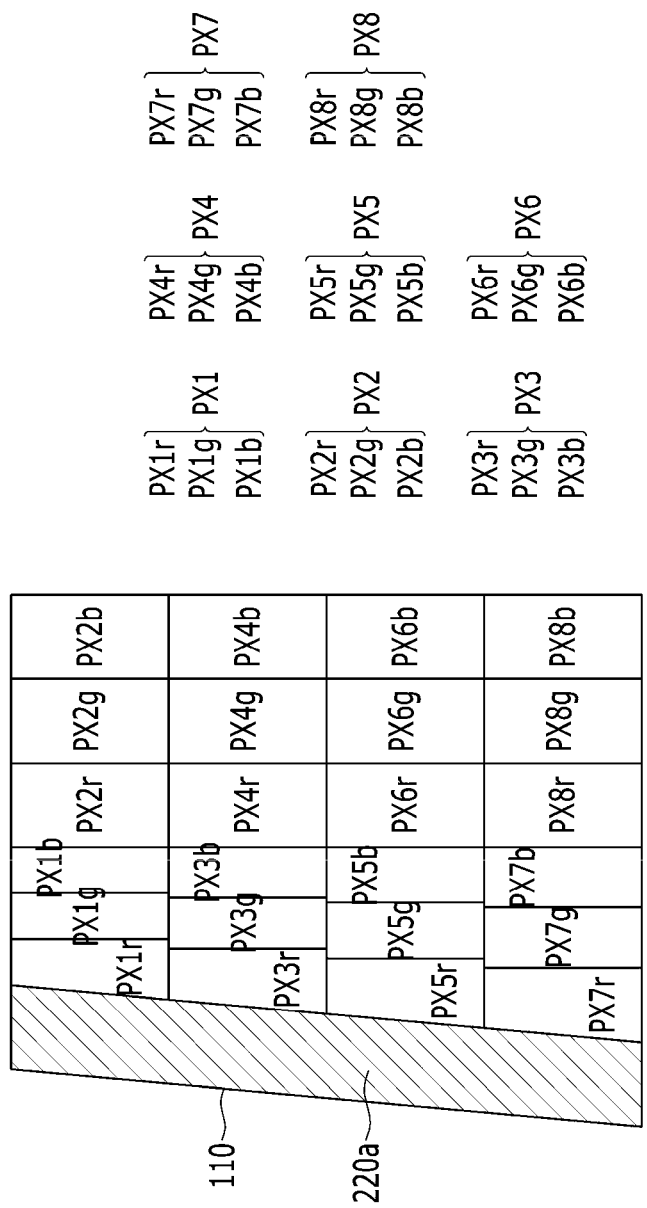
FIG. 14 is a top plan view showing a portion of pixels of a display device according to an exemplary embodiment.

FIG. 14 is a top plan view showing a portion of pixels of a display device according to an exemplary embodiment. FIG. 14 shows pixels disposed on a rounded edge and pixels adjacent thereto.

A first pixel PX1, a second pixel PX2, a third pixel PX3, a fourth pixel PX4, a fifth pixel PX5, a sixth pixel PX6, a seventh pixel PX7, and an eighth pixel PX8 are positioned on the first substrate 110 of the display device according to an exemplary embodiment.

The outside light blocking member 220a overlaps the edge of the first substrate 110, and some pixels of the plurality of pixels PX1, PX2, PX3, PX4, PX5, PX6, PX7, and PX8 may be adjacent to the outside light blocking member 220a. For example, the first pixel PX1, the third pixel PX3, the fifth pixel PX5 and the seventh pixel PX7 may be adjacent to the outside light blocking member 220a.

The second pixel PX2 is disposed farther from the edge of the first substrate 110 than the first pixel PX1, and the fourth pixel PX4 is disposed farther from the edge of the first substrate 110 than the third pixel PX3. The sixth pixel PX6 is disposed farther from the edge of the first substrate 110 than the fifth pixel PX5, and the eighth pixel PX8 is disposed farther from the edge of the first substrate 110 than the seventh pixel PX7.

A size of the first pixel PX1 is smaller than a size of the second pixel PX2. In this case, the first subpixel PX1r, the second subpixel PX1g, and third subpixel PX1b of the first pixel PX1 are substantially the same size. However, a shape of the first subpixel PX1r, a shape of the second subpixel PX1g, and a shape of the third subpixel PX1b of the first pixel PX1 in a plan view may be different from each other. For example, a shape of the second subpixel PX1g and a shape of the third subpixel PX1b in a plan view may be approximately rectangular. A shape of the first subpixel PX1r of the first pixel PX1 in a plan view may be approximately trapezoidal. A shape of the first subpixel PX1r of the first pixel PX1 in a plan view may also be a figure including three straight lines and a curved line.

A length of a lower edge of the first subpixel PX1r of the first pixel PX1 may be longer than a length of a lower edge of the second subpixel PX1g of the first pixel PX1. Also, a length of an upper edge of the first subpixel PX1r of the first pixel PX1 is shorter than a length of an upper edge of the second subpixel PX1g of the first pixel PX1. The exemplary embodiment is not limited thereto, and a shape of the first subpixel PX1r may be variously changed according to a shape of the outside light blocking member 220a. For example, the length of the upper edge of the first subpixel PX1r of the first pixel PX1 may be longer than the length of the upper edge of the second subpixel PX1g of the first pixel PX1. In the case, the length of the lower edge of the first subpixel PX1r of the first pixel PX1 is shorter than the length of the lower edge of the second subpixel PX1g of the first pixel PX1.

Although a shape of the first subpixel PX1r, a shape of the second subpixel PX1g, and a shape of the third subpixel PX1b of the first pixel PX1 are different from each other, a size of the first subpixel PX1r, a size of the second subpixel PX1g, and a size of the third subpixel PX1b of the first pixel PX1 are substantially the same, thus it is possible to prevent color shift from being generated in the first pixel PX1. Luminance of the first pixel PX1 may be lower than luminance of the second pixel PX2. In this case, a width Wb of the fine branches 194 disposed in the first pixel PX1 is wider than a width Wb of the fine branches 194 disposed in the second pixel PX2, so that any decrease in luminance of the subpixel may be compensated. That is, luminance of the first pixel PX1 and luminance of the second pixel PX2 may become substantially the same. A space Ws between the fine branches 194 disposed in the first pixel PX1 may be narrower than a space Ws between the fine branches 194 disposed in the second pixel PX2. A pitch Wp of the pixel electrode 191 disposed in the first pixel PX1 may be substantially the same as a pitch Wp of the pixel electrode 191 disposed in the second pixel PX2.

In the present exemplary embodiment, by controlling a width Wb of the fine branches 194 disposed in the first pixel PX1, reduction in luminance of the subpixel may be compensated. However, the present invention is not limited thereto. For example, by alternatively having an angle θ between the horizontal stem 193 and the fine branches 194 disposed in the first pixel PX1 that is greater than an angle θ between the horizontal stem 193 and the fine branches 194 disposed in the second pixel PX2, a decrement of the luminance of the subpixel may be compensated.

A size of the third pixel PX3 is smaller than a size of the fourth pixel PX4. In this case, a size of the first subpixel PX3r, a size of the second subpixel PX3g, and a size of the third subpixel PX3b of the third pixel PX3 are substantially the same. However, a shape of the first subpixel PX3r, a shape of the second subpixel PX3g, and a shape of the third subpixel PX3b of the third pixel PX3 in a plan view may be different from each other.

Though a shape of the first subpixel PX3r, a shape of the second subpixel PX3g, and a shape of the third subpixel PX3b of the third pixel PX3 are different from each other, a size of the first subpixel PX3r, a size of the second subpixel PX3g, and a size of the third subpixel PX3b of the third pixel PX3 are substantially the same, thus it is possible to prevent color shift from being generated in the third pixel PX3. Luminance of the third pixel PX3 may be lower than luminance of the fourth pixel PX4. In this case, by having a width Wb of the fine branches 194 disposed in the third pixel PX3 that is wider than a width Wb of the fine branches 194 disposed in the fourth pixel PX4, a decrement of the luminance of the subpixel may be compensated. A size of the third pixel PX3 is larger than a size of the first pixel PX1.

Thus, luminance of the third pixel PX3 is higher than luminance of the first pixel PX1. A width Wb of the fine branches 194 disposed in the third pixel PX3 may be narrower than a width Wb of the fine branches 194 disposed in the first pixel PX1.

Further, by having an angle θ between the horizontal stem 193 and the fine branches 194 disposed in the third pixel PX3 that is greater than an angle θ between the horizontal stem 193 and the fine branches 194 disposed in the fourth pixel PX4, a decrement of the luminance of the subpixel may be compensated. In this case, an angle θ between the horizontal stem 193 and the fine branches 194 disposed in the third pixel PX3 may be smaller than an angle θ between the horizontal stem 193 and the fine branches 194 disposed in the first pixel PX1.

A size of the fifth pixel PX5 is smaller than a size of the sixth pixel PX6. In this case, a size of the first subpixel PX5r, a size of the second subpixel PX5g, and a size of the third subpixel PX5b of the fifth pixel PX5 are substantially the same. However, a shape of the first subpixel PX5r, a shape of the second subpixel PX5g, and a shape of the third subpixel PX5b of the fifth pixel PX5 in a plan view may be different from each other.

Although a shape of the first subpixel PX5r, a shape of the second subpixel PX5g, and a shape of the third subpixel PX5b of the fifth pixel PX5 are different from each other, a size of the first subpixel PX5r, a size of the second subpixel PX5g, and a size of the third subpixel PX5b of the fifth pixel PX5 are substantially the same. Thus, it is possible to prevent color shift from being generated in the fifth pixel PX5. Luminance of the fifth pixel PX5 may be lower than luminance of the sixth pixel PX6. In this case, by having a width Wb of the fine branches 194 disposed in the fifth pixel PX5 that is wider than a width Wb of the fine branches 194 disposed in the sixth pixel PX6, a decrement of the luminance of the subpixel may be compensated. A size of the fifth pixel PX5 is larger than a size of the third pixel PX3. Thus, luminance of the fifth pixel PX5 is higher than luminance of the third pixel PX3. A width Wb of the fine branch 194 disposed in the fifth pixel PX5 may be narrower than a width Wb of the fine branch 194 disposed in the third pixel PX3.

Further, by having an angle θ between the horizontal stem 193 and the fine branches 194 disposed in the fifth pixel PX5 that is greater than an angle θ between the horizontal stem 193 and the fine branches 194 disposed in the sixth pixel PX6, a decrement of the luminance of the subpixel may be compensated. In this case, an angle θ between the horizontal stem 193 and the fine branches 194 disposed in the fifth pixel PX5 may be smaller than an angle θ between the horizontal stem 193 and the fine branches 194 disposed in the third pixel PX3.

A size of the seventh pixel PX7 is smaller than a size of the eighth pixel PX8. In this case, a size of the first subpixel PX7r, a size of the second subpixel PX7g, and a size of the third subpixel PX7b of the seventh pixel PX7 are substantially the same. However, a shape of the first subpixel PX7r, a shape of the second subpixel PX7g, and a shape of the third subpixel PX7b of the seventh pixel PX7 in a plan view may be different from each other.

Although a shape of the first subpixel PX7r, a shape of the second subpixel PX7g, and a shape of the third subpixel PX7b of the seventh pixel PX7 are different from each other, a size of the first subpixel PX7r, a size of the second subpixel PX7g, and a size of the third subpixel PX7b of the seventh pixel PX7 are substantially the same. Thus, it is possible to prevent color shift from being generated in the seventh pixel PX7. Luminance of the seventh pixel PX7 may be lower than luminance of the eighth pixel PX8. In this case, by having a width Wb of the fine branches 194 disposed in the seventh pixel PX7 that is wider than a width Wb of the fine branches 194 disposed in the eighth pixel PX8, a decrement of the luminance of the subpixel may be compensated. A size of the seventh pixel PX7 is larger than a size of the fifth pixel PX5. Thus, luminance of the seventh pixel PX7 is higher than luminance of the fifth pixel PX5. A width Wb of the fine branches 194 disposed in the seventh pixel PX7 may be narrower than a width Wb of the fine branches 194 disposed in the fifth pixel PX5.

Further, by having an angle θ between the horizontal stem 193 and the fine branches 194 disposed in the seventh pixel PX7 that is greater than an angle θ between the horizontal stem 193 and the fine branches 194 disposed in the eighth pixel PX8, a decrement of the luminance of the subpixel may be compensated. In this case, an angle θ between the horizontal stem 193 and the fine branches 194 disposed in the seventh pixel PX7 may be smaller than an angle θ between the horizontal stem 193 and the fine branches 194 disposed in the fifth pixel PX5.

Next, a display device according to an exemplary embodiment will be described with reference to FIG. 15.

The present exemplary embodiment is similar to the display device according to the exemplary embodiment shown in FIG. 14 such that redundant description thereof is omitted. In the present exemplary embodiment, an area of the first pixel and an area of the second pixel are substantially the same, different from the previous exemplary embodiment, and this will be described in detail.

Figure 15:
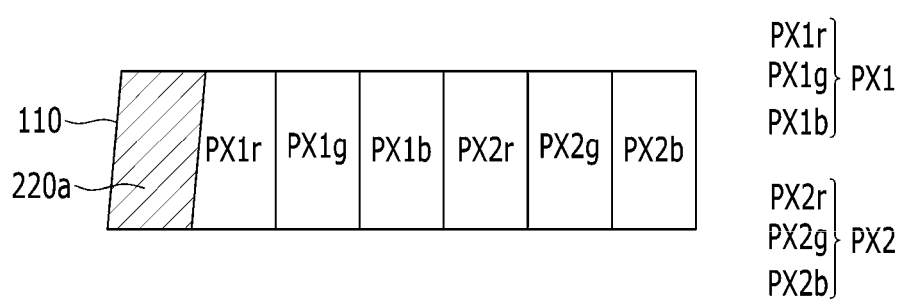
FIG. 15 is a top plan view showing a portion of pixels of a display device according to an exemplary embodiment.

FIG. 15 is a top plan view showing a portion of pixels of a display device according to an exemplary embodiment.

A first pixel PX1 and a second pixel PX2 are positioned on the first substrate 110 of the display device according to an exemplary embodiment. The outside light blocking member 220a overlaps the edge of the first substrate 110. Also, the first pixel PX1 may be adjacent to the outside light blocking member 220a and the second pixel PX2 may be adjacent to the first pixel PX1. The second pixel PX2 is disposed farther from the edge of the first substrate 110 than the first pixel PX1.

A size of the first pixel PX1 and a size of the second pixel PX2 are substantially the same. A size of the first subpixel PX1r, a size of the second subpixel PX1g, and a size of the third subpixel PX1b of the first pixel PX1, and a size of the first subpixel PX2r, a size of the second subpixel PX2g, and a size of the third subpixel PX2b of the second pixel PX2, are substantially the same. However, a shape of the first subpixel PX1r, a shape of the second subpixel PX1g, and a shape of the third subpixel PX1b of the first pixel PX1, and a shape of the first subpixel PX2r, a shape of the second subpixel PX2g, and a shape of the third subpixel PX2b of the second pixel PX2 in a plan view may be different from each other. For example, a shape of the second subpixel PX1g and a shape of the third subpixel PX1b of the first pixel PX1, and a shape of the first subpixel PX2r, a shape of the second subpixel PX2g, and a shape of the third subpixel PX2b of the second pixel PX2, may be approximately rectangular. A shape of the first subpixel PX1r of the first pixel PX1 in a plan view may be approximately trapezoidal. A shape of the first subpixel PX1r of the first pixel PX1 in a plan view may alternatively be a figure including three straight lines and a curved line.

Although a shape of the first subpixel PX1r, a shape of the second subpixel PX1g, and a shape of the third subpixel PX1b of the first pixel PX1, and a shape of the first subpixel PX2r, a shape of the second subpixel PX2g, and a shape of the third subpixel PX2b of the second pixel PX2 are different from each other, a size of the first subpixel PX1r, a size of the second subpixel PX1g, and a size of the third subpixel PX1b of the first pixel PX1, and a size of the first subpixel PX2r, a size of the second subpixel PX2g, and a size of the third subpixel PX2b of the second pixel PX2 are substantially the same. Thus, it is possible to prevent color shift from being generated in the first pixel PX1. Further, luminance of the first pixel PX1 and luminance of the second pixel PX2 may become substantially the same.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims. Various features of the above described and other embodiments can be mixed and matched in any manner, to produce further embodiments consistent with the invention.

DESCRIPTION OF SYMBOLS

110: first substrate
191: pixel electrode
192: vertical stem
193: horizontal stem
194: fine branch
195: fine slit
220a: outside light blocking member

What is claimed is:

1. A display device comprising:
a substrate;
a light blocking member disposed around a display area of the substrate, wherein a corner of the light blocking member has a rounded edge; and
a plurality of pixels disposed on the substrate,
wherein the plurality of pixels comprises:
a first subpixel directly adjacent to the light blocking member; and
a second subpixel directly adjacent to the first subpixel, and
wherein a length of an upper edge of the first subpixel is longer than a length of an upper edge of the second subpixel, or a length of a lower edge of the first subpixel is longer than a length of a lower edge of the second subpixel.

2. The display device of claim 1, wherein
a pixel electrode disposed in the plurality of pixels, respectively, wherein the pixel electrode has a horizontal stem, a vertical stem, and a plurality of fine branches,
wherein a size of the first pixel is smaller than a size of the second pixel.

3. The display device of claim 2, wherein
a shape of the fine branch disposed in the first pixel is different from a shape of the fine branch disposed in the second pixel.

4. The display device of claim 3, wherein
the second pixel is disposed farther from the edge of the substrate than the first pixel.

5. The display device of claim 4, wherein
a width of the fine branch disposed in the first pixel is wider than a width of the fine branch disposed in the second pixel.

6. The display device of claim 5, wherein
a space between the fine branches disposed in the first pixel is narrower than a space between the fine branches disposed in the second pixel.

7. The display device of claim 4, wherein
an angle between the horizontal stem and the fine branch disposed in the first pixel is larger than an angle between the horizontal stem and the fine branch disposed in the second pixel.

8. The display device of claim 4, wherein the plurality of pixels respectively includes:
a first subpixel representing a first color;
a second subpixel representing a second color; and
a third subpixel representing a third color,
wherein a size of the first subpixel, a size of the second subpixel, and a size of the third subpixel are substantially the same, and
wherein a shape of the first subpixel, a shape of the second pixel, and a shape of the third subpixel are different from each other.

9. The display device of claim 1, wherein
the second subpixel is disposed farther from the edge of the substrate than the first subpixel.

10. The display device of claim 9, wherein
an area of the second subpixel is substantially the same as an area of the first subpixel.

11. The display device of claim 10, wherein:
when the length of the upper edge of the first subpixel is longer than the length of the upper edge of the second subpixel, the length of the lower edge of the first subpixel is shorter than the length of the lower edge of the second subpixel; and
when the length of the lower edge of the first subpixel is longer than the length of the lower edge of the second subpixel, the length of the upper edge of the first subpixel is shorter than the length of the upper edge of the second subpixel.

* * * * *